US008102408B2

(12) United States Patent
Verma et al.

(10) Patent No.: US 8,102,408 B2
(45) Date of Patent: Jan. 24, 2012

(54) COMPUTER-IMPLEMENTED METHODS AND SYSTEMS FOR DETERMINING DIFFERENT PROCESS WINDOWS FOR A WAFER PRINTING PROCESS FOR DIFFERENT RETICLE DESIGNS

(75) Inventors: Gaurav Verma, Sunnyvale, CA (US);
Bo Su, San Jose, CA (US); William Volk, San Francisco, CA (US); Harold Lehon, Santa Cruz, CA (US); Carl Hess, Los Altos, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 1244 days.

(21) Appl. No.: 11/770,437

(22) Filed: Jun. 28, 2007
(Under 37 CFR 1.47)

(65) Prior Publication Data

US 2008/0072207 A1    Mar. 20, 2008

Related U.S. Application Data

(60) Provisional application No. 60/806,173, filed on Jun. 29, 2006.

(51) Int. Cl.
*H04N 7/18* (2006.01)
(52) U.S. Cl. ............... 346/87; 716/52; 716/56
(58) Field of Classification Search ........... 348/86, 348/87; 716/51, 52, 54, 56
See application file for complete search history.

(56) References Cited

U.S. PATENT DOCUMENTS

| | | | |
|---|---|---|---|
| 6,373,975 B1 * | 4/2002 | Bula et al. | |
| 6,513,151 B1 * | 1/2003 | Erhardt et al. | 716/51 |
| 6,873,720 B2 * | 3/2005 | Cai et al. | |
| 6,902,855 B2 * | 6/2005 | Peterson et al. | |
| 6,999,611 B1 * | 2/2006 | Lopez et al. | |
| 7,297,453 B2 * | 11/2007 | Watson et al. | 430/30 |
| 7,406,675 B2 * | 7/2008 | Uzhakov et al. | 716/51 |
| 2002/0035461 A1 * | 3/2002 | Chang et al. | |
| 2002/0164064 A1 * | 11/2002 | Karklin et al. | |
| 2003/0119216 A1 * | 6/2003 | Weed | |
| 2004/0057610 A1 * | 3/2004 | Filseth et al. | |
| 2004/0091142 A1 * | 5/2004 | Peterson et al. | |
| 2005/0004774 A1 * | 1/2005 | Volk et al. | |
| 2006/0036979 A1 * | 2/2006 | Zurbrick et al. | |
| 2006/0051682 A1 * | 3/2006 | Hess et al. | |
| 2006/0062445 A1 * | 3/2006 | Verma et al. | |
| 2006/0291714 A1 * | 12/2006 | Wu et al. | |
| 2007/0156379 A1 * | 7/2007 | Kulkarni et al. | |
| 2007/0288219 A1 * | 12/2007 | Zafar et al. | |

OTHER PUBLICATIONS

U.S. Appl. No. 10/679,617, filed Oct. 6, 2003, Stokowski et al.*
U.S. Appl. No. 10/778,752, filed Feb. 13, 2004, Preil et al.*
International Search Report and Written Opinion for PCT Application No. PCT/US07/72515 dated Dec. 18, 2007.

* cited by examiner

*Primary Examiner* — Viet Vu
(74) *Attorney, Agent, or Firm* — Ann Marie Mewherter

(57) ABSTRACT

Computer-implemented methods and systems for determining different process windows for a wafer printing process for different reticle designs are provided. One method includes generating simulated images illustrating how each of the different reticle designs will be printed on a wafer at different values of one or more parameters of the wafer printing process. The method also includes detecting defects in each of the different reticle designs using the simulated images. In addition, the method includes determining a process window for the wafer printing process for each of the different reticle designs based on results of the detecting step.

21 Claims, 13 Drawing Sheets

COMPUTER-IMPLEMENTED METHODS AND SYSTEMS FOR DETERMINING DIFFERENT PROCESS WINDOWS FOR A WAFER PRINTING PROCESS FOR DIFFERENT RETICLE DESIGNS

PRIORITY CLAIM

This application claims priority to U.S. Provisional Application Nos. 60/806,173 entitled "Computer-implemented Methods and Systems for Determining Different Process Windows for a Wafer Printing Process for Different Reticle Designs," filed Jun. 29, 2006, which is incorporated by reference as if fully set forth herein.

BACKGROUND OF THE INVENTION

1. Field of the Invention

The present invention generally relates to computer-implemented methods and systems for determining different process windows for a wafer printing process for different reticle designs. Certain embodiments relate to determining a process window for a wafer printing process for each of different reticle designs based on results of detecting defects in each of the different reticle designs using simulated images.

2. Description of the Related Art

The following descriptions and examples are not admitted to be prior art by virtue of their inclusion within this section.

Fabricating semiconductor devices such as logic and memory devices typically includes processing a substrate such as a semiconductor wafer using a number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a semiconductor wafer and then separated into individual semiconductor devices.

Lithography is typically one of the most important processes in integrated circuit manufacturing since this is the process in which features are patterned on the wafer. The pattern printed in a resist by lithography is then utilized as a masking layer to transfer the pattern to additional layers on the wafer in subsequent processing steps. Therefore, the pattern that is formed on the wafer during lithography directly affects the features of the integrated circuits that are formed on the wafer. Consequently, defects that are formed on a wafer during lithography may be particularly problematic for the integrated circuit manufacturing process. One of the many ways in which defects may be formed on the patterned wafer during lithography is by transfer of defects that are present on the reticle to the wafer. Therefore, detection and correction of defects on the reticle such as unwanted particulate or other matter is performed rather stringently to prevent as many defects on the reticle from being transferred to the wafer during lithography.

However, as the dimensions of integrated circuits decrease and the patterns being transferred from the reticle to the wafer become more complex, defects or marginalities in the features formed on the reticle become increasingly important. In particular, if the pattern is not formed accurately on the reticle, such discrepancies increasingly produce defects on the wafer as the dimensions of the pattern decrease and the complexity of the pattern increases. In addition, marginalities in the reticle design may cause the design to print incorrectly on the wafer. Therefore, significant efforts have beet devoted to methods and systems that can be used to detect problems in the pattern on the reticle or in the design that will cause problems on the wafer. These efforts are relatively complex and difficult due, at least in part, to the fact that not all discrepancies or marginalities in the pattern formed on the reticle (as compared to the ideal pattern) will cause errors on the wafer that will adversely affect the integrated circuit. In other words, some errors in the pattern formed on the reticle may not produce defects on the wafer at all or may produce defects on the wafer that will not reduce the performance characteristics of the integrated circuit. Therefore, one challenge of many in developing adequate methods and systems for qualifying a reticle pattern is to discriminate between pattern defects or marginalities that "matter" and those that do not.

One way to check a reticle pattern before the reticle is fabricated is design rule checking (DRC). However, conventional DRC operates only at the nominal process conditions, or at most, at a limited number of process conditions and/or at a limited number of points within the device. Other software based methods for detecting design pattern defects prior to fabrication of the reticle have been proposed, and one such method is described in U.S. Patent Application Publication No. 2003/0119216A1 by Weed, which is incorporated by reference as if fully set forth herein. However, this method is designed to determine only the best focus and exposure settings and not to explore the full range of the process window conditions available for each design. Another method described in U.S. Pat. No. 6,373,975 to Bula et al., which is incorporated by reference as if fully set forth herein, runs simulations only to test for specific design rule violations and does not compare full chip simulated images to a reference to detect arbitrary defects.

Therefore, such software methods have several disadvantages. In particular, these software methods do not examine the full range of process window conditions thereby possibly failing to detect process window marginalities and missing potential defects. In addition, these methods do not determine the exact focus and exposure conditions under which defects will occur thereby preventing the complete optimization of the design. The lack of complete process window information also limits the ability to implement advanced process control techniques for critical dimension control across all critical features on the device.

Accordingly, it would be desirable to develop methods and systems that can detect reticle design defects or marginalities within an entire chip and across a range of process conditions such as focus and exposure before the reticle is manufactured to reduce the cost of fabricating a reticle that is qualified for use in integrated circuit manufacturing and to reduce the time involved in fabricating a reticle that passes qualification for integrated circuit manufacturing. Additionally, it would be desirable to develop methods and systems that can be used to determine different process windows for a wafer printing process for different reticle designs.

SUMMARY OF THE INVENTION

The following description of various embodiments of computer-implemented methods, carrier media, and systems is not to be construed in any way as limiting the subject matter of the appended claims.

One embodiment relates to a computer-implemented method for determining different process windows for a wafer printing process for different reticle designs. The method includes generating simulated images illustrating how each of the different reticle designs will be printed on a wafer at different values of one or more parameters of the wafer printing process. The method also includes detecting defects in each of the different reticle designs using the simulated images. In addition, the method includes determining a process window for the wafer printing process for each of the different reticle designs based on results of the detecting step.

In one embodiment, generating the simulated images includes generating first simulated images illustrating how each of the different reticle designs will be printed on a reticle using a reticle manufacturing process and generating the simulated images using the first simulated images. In another embodiment, the simulated images include simulated images of a complete chip defined by each of the different reticle designs. In an additional embodiment, subsequent to determining the process windows, the method includes generating additional simulated images illustrating how each of the different reticle designs will be printed on the wafer at other different values of the one or more parameters. Differences between the other different values are finer than differences between the different values. Such a method also includes performing the detecting step using the additional simulated images and performing the determining step based on results of the detecting step performed using the additional simulated images.

In one embodiment, the method includes determining a center of the process window for each of the different reticle designs based on the results of the detecting step. In one such embodiment, the center of the process window is different for at least some of the different reticle designs. In another embodiment, the method includes determining a center of the process window for each of the different reticle designs based on the results of the detecting step such that a distance between the center and process window boundaries for each of the different reticle designs is maximized. In an additional embodiment, the method includes determining a center of the process window for each of the different reticle designs based on the results of the detecting step and performing the method, for each of the different reticle designs for which the center is different than predetermined nominal values for the one or more parameters, using other different values of the one or more parameters defined based on the center.

In one embodiment, the method includes altering at least one of the different reticle designs based on the results of the detecting step. In one such embodiment, the altering step includes altering resolution enhancement technology features of the at least one of the different reticle designs. In another embodiment, if the defects are detected for at least one of the different reticle designs, the method includes determining a center of the process window for the at least one reticle design based on the results of the detecting step. In one such embodiment, the method also includes performing the method for the at least one reticle design until the defects are not detected for the at least one reticle design.

In some embodiments, the method includes generating additional simulated images illustrating how each of the different reticle designs will be printed on the wafer at different values of one or more other parameters of the wafer printing process, performing the detecting step using the additional simulated images, and optimizing the wafer printing process for each of the different reticle designs by selecting values for the one or more other parameters for each of the different reticle designs based on the results of the detecting step performed using the additional simulated images.

In one embodiment, the different values span a predetermined process window for the one or more parameters of the wafer printing process. In another embodiment, the detecting step includes determining which of the different values at which at least one of the defects appears in the simulated images. In an additional embodiment, the detecting step includes determining one or more patterns in each of the different reticle designs in which the defects appear at the different values that are closer to nominal values for the one or more parameters than the different values at which the defects appear in other patterns in each of the different reticle designs.

In a further embodiment, the method includes performing the method using other different values of the one or more parameters that exceed a predetermined process window for the one or more parameters of the wafer printing process. In one such embodiment, the detecting step using the simulated images generated at the other different values includes determining, one or more patterns in each of the different reticle designs in which the defects appear at the other different values that are closer to nominal values for the one or more parameters than the other different values at which the defects appear in other patterns in each of the different reticle designs.

In one embodiment, the method includes generating a reticle manufacturing process for at least one of the different reticle designs based on the results of the detecting step. In another embodiment, the method includes generating an inspection process for at least one of the different reticle designs based on the results of the detecting step. In a further embodiment, the method includes generating a monitoring process for the wafer printing process for at least one of the different reticle designs based on the results of the detecting step. Each of the steps of the method described above may be performed according to any of the embodiments described herein. Each of the embodiments of the method described above may include any other step(s) described herein.

Another embodiment relates to a carrier medium that includes program instructions executable on a processor for performing a method for determining different process windows for a wafer printing process for different reticle designs. The method includes generating simulated images illustrating how each of the different reticle designs will be printed on a wafer at different values of one or more parameters of the wafer printing process. The method also includes detecting defects in each of the different reticle designs using the simulated images. In addition, the method includes determining a process window for the wafer printing process or each of the different reticle designs based on results of the detecting step. Each of the steps of the method may be performed according to any of the embodiments described herein. The method may also include any other step(s) described herein.

An additional embodiment relates to a system configured to determine different process windows for a wafer printing process for different reticle designs. The system includes a simulation engine configured to generate simulated images illustrating how each of the different reticle designs will be printed on a wafer at different values of one or more parameters of the wafer printing process. The system also includes a processor configured to detect defects in each of the different reticle designs using the simulated images and to determine a process window for the wafer printing process for each of the different reticle designs based on the defects. The system described above may be further configured as described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
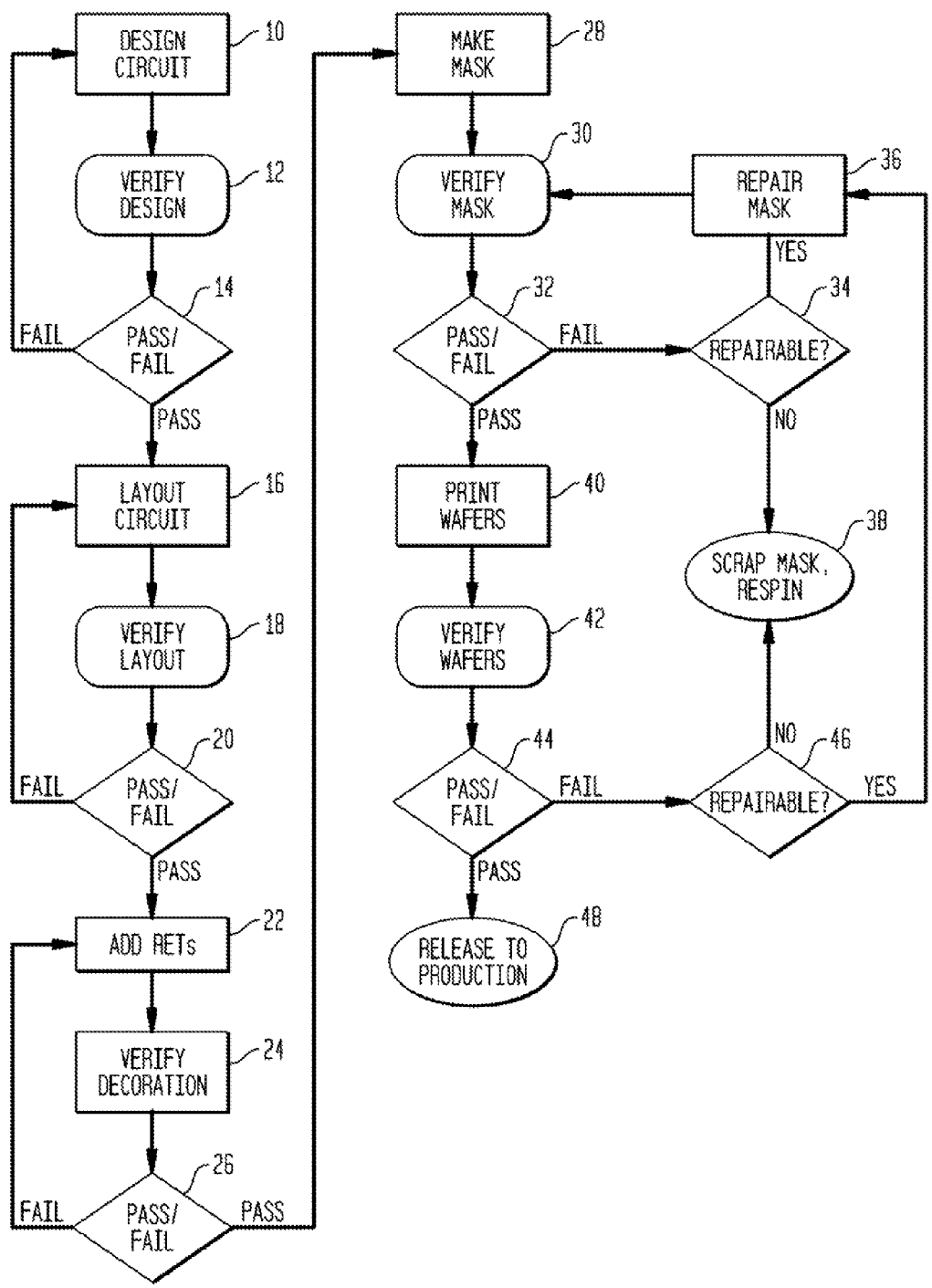
FIG. 1 is a flow chart illustrating a method for qualifying a reticle for production in integrated circuit manufacturing.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "wafer" generally refers to a substrate formed of a semiconductor or non-semiconductor material. Examples of such a semiconductor or non-semiconductor material include, but are not limited to, monocrystalline silicon, gallium arsenide, and indium phosphine. Such substrates may be commonly found and/or processed in semiconductor fabrication facilities.

A wafer may include only the substrate. Such a wafer is commonly referred to as a "virgin wafer." Alternatively, a wafer may include one or more layers formed upon a substrate. For example, such layers may include, but are not limited to, a resist, a dielectric material, and a conductive material. A resist may include any material that may be patterned by an optical lithography technique, an e-beam lithography technique or an X-ray lithography technique. Examples of a dielectric material include, but are not limited to, silicon dioxide, silicon nitride, silicon oxynitride, and titanium nitride. Additional examples of a dielectric material include "low-." dielectric materials such as Black Diamond™ which is commercially available from Applied Materials, Inc., Santa Clara, Calif., and CORAL™ commercially available from Novellus Systems, Inc., San Jose, Calif., "ultra-low k" dielectric materials such as "xerogels," and "high-k" dielectric materials such, as tantalum pent oxides. In addition, examples of a conductive material include, but are not limited to, aluminum, polysilicon, and copper.

One or more layers formed on a wafer may be patterned or unpatented. For example, a wafer may include a plurality of dies having repeatable patterned features. Formation and processing of such layers of material may ultimately result in completed semiconductor devices. As such, a wafer may include a substrate on which not all layers of a complete semiconductor device have been formed or a substrate on which all layers of a complete semiconductor device have been formed. The term "semiconductor device" is used interchangeably herein with the term "integrated circuit." In addition, other devices such as microelectromechanical system (MEMS) devices and the like may also be formed on a wafer.

A "reticle" or a "mask" is generally defined as a substantially transparent substrate having substantially opaque regions formed thereon and configured in a pattern. The substrate may include, for example, a glass material such as quartz. The substantially opaque regions may be formed of a material such as chromium. A reticle may be disposed above a resist-covered wafer during an exposure step of a lithography process such that the pattern on the reticle may be transferred to the resist. For example, substantially opaque regions of the reticle may protect underlying regions of the resist from exposure to an energy source. Many different types of reticules are known in the art, and the term reticle as used herein is intended to encompass all types of reticles.

As used herein, the term "detects" refers to marginalities in a reticle design that will cause the reticle design to print incorrectly on a wafer. In addition, the defects may print on the wafer at only certain values of one or more parameters of a wafer printing process. The term "wafer printing process" is used interchangeably herein with the term "lithography process."

The terms "first" and "second" are used herein only to distinguish between different simulated images different regions on a reticle, etc. and are not to be construed in any other manner.

One particularly successful method for qualifying a reticle for integrated circuit manufacturing is the process window qualification (PWQ) method that is described in commonly-assigned U.S. patent application Ser. No. 09/211,156 by Peterson et al., filed Aug. 2, 2002, issued as U.S. Pat. No. 6,902,855 on Jun. 7, 2005, which is incorporated by reference as if fully set forth herein. This method generally involves printing a fabricated photomask on a wafer and inspecting the wafer in a specified manner to detect design marginalities, which will cause failures and low yield on production wafers. While effective for design defect detection, PWQ cannot detect the design defects until after the mask or reticle has been fabricated, often at very high cost. In addition, correcting the reticle design and fabricating a new mask with the corrected design for additional design defect detection are also both expensive and time consuming.

To detect marginalities in reticle design data before a reticle is even made, computer-implemented methods have been developed and are described herein, which are generally referred to herein as "virtual process window qualification" (vPWQ). Instead of fabricating an actual mask and printing actual wafers with the mask, vPWQ uses the reticle design data to simulate what the mask and wafer would look like if the reticle design data was printed on the mask and wafer, respectively. The simulated images of what the reticle design data would look like on the wafer may be generated across the full range of focus and exposure conditions expected to be used in the production environment.

In vPWQ, defects are detected by comparing a reference image to different simulated images illustrating how the reticle design data would be printed on a wafer, which are generated for different values of focus and exposure and/or other parameters of the wafer printing process. The reference image may represent how the reticle design data would be printed on the wafer at the best focus/best exposure conditions or nominal focus and exposure conditions. Alternatively, the reference image may be the ideal image of the reticle design data, which can be generated from the design data prior to optical proximity correction (OPC) "decoration" (i.e., prior to modification of the reticle design data by the OPC data). Therefore, in essence, vPWQ is a virtual wafer to database inspection method, where the virtual wafer is generated for different focus and exposure conditions, preferably across the entire process window that will be used for the reticle in a lithography process. In this manner, the complete design layout (including OPC and other reticle enhancement techniques (RETs)) can be optimized for the best possible range of valid focus and exposure conditions (i.e., the latest process window) before the design is committed to the mask.

In general, therefore, one embodiment of a computer-implemented method for detecting defects in reticle design data includes generating a first simulated image illustrating how the reticle design data will be printed on a reticle using a reticle manufacturing process. In one embodiment, vPWQ uses the design database, including all optical enhancements (OPC, phase shifting features, and other RET), and simulates how the mask will be manufactured. In this manner, the reticle design data used in the methods described herein may include reticle design data modified by RET feature data.

The method also includes generating second simulated images using the first simulated image. The second simulated images illustrate how the reticle will be printed on a wafer at different values of one or more parameters of a wafer printing process. For instance, generating the second simulated images can be performed using one or more models such as a resist model (e.g., a model of the resist that will be printed with the reticle design data on the wafer) and a lithography model (e.g., a model of the optical parameters of an exposure tool that will be used to print the reticle on the wafer and a model of other process steps involved in the lithography process such as develop ad post exposure bake). Such models and/or parameters for such models may be acquired from one or more sources such as the PROLITH software, which is commercially available from KLA-Tencor, San Jose. Calif.

The different values at which the second images are simulated may span a predetermined process window for the one or more parameters of the wafer printing process. For example, the predetermined process window may be a process window that is desired or available for the wafer printing process to be used with the reticle. However, as described further herein, the actual process window that is determined for use with the reticle design data may be smaller than this predetermined process window. The one or more parameters may include, but are not limited to, dose and focus. For example, the one or more parameters may also include different types of illumination that are available for use with the reticle (e.g., annular and quadrapole). In one embodiment, the second simulated images, which are also referred to herein as "test images," may illustrate how the actual mask will be printed at the wafer level across the full range of focus and exposure conditions. The first and second simulated images may include simulated images of a complete chip defined by the reticle design data.

vPWQ, therefore, involves breaking the simulation into 2 steps: 1) using a database description of the reticle design to tender a simulated image of how the reticle will be written (simulating the reticle manufacturing process); and 2) using the simulated reticle pattern to render simulated wafer patterns. This 2 step approach has many advantages. For example, this approach allows the user to simulate not just the reticle design, but the combination of reticle design data plus mask manufacturing process, thus enabling selection of the best mask making process for a given design and/or optimization of the design rules for the selected process. This approach also produces more accurate simulations by removing the design to mask offset.

In addition, the method includes detecting defects in the reticle design data using the second simulated images. For example, the test images may be compared to a reference image on a point by point basis, and defects are identified in the test images using, for example, algorithms. The algorithms that are used for the methods described herein may be the same as, or substantially similar to, those used in typical reticle inspection. In one embodiment, the reference image that is compared to the second simulated images for defect detection includes a simulated image illustrating how the reticle will be printed on the wafer at nominal values of the one or more parameters of the wafer printing process. In a different embodiment, the reference image that is compared to the second simulated images for defect detection illustrates how the reticle design data would ideally be printed on the wafer. In this manner, the reference image can either be the circuit layout as ideally conceived by the designer prior to RET decoration or the simulated wafer image under the best focus and exposure conditions.

The reference images used for defect detection may also be variations of the reference images described above. For example, as described above, the reference image can be the reticle pattern layout intended by the designer or the pattern simulated at best focus and exposure conditions. This "designer intended" layout can be modified by simulating the expected mask to design bias so that the reference image illustrates the undecorated pattern that will be printed on a reticle under nominal mask making conditions.

The reference image can also be a simulated image illustrating how the reticle design data will be printed on a wafer under best focus and exposure conditions. The usefulness of this simulated reference image could be improved by calibrating the simulation model using wafer print images and/or data of standard test cells that are also included in the design under test. Alternatively, the reference simulated image may be modified by using wafer print images and/or data for sections of the new design that had been included in previous or test reticles, which is thereby available at the wafer level.

The reference image simulation can also be calibrated using aerial image data collected from prior designs or test reticules. The reference aerial image data may be generated by inserting an existing reticle in a scanner and monitoring the aerial image at the wafer plane. Alternatively, the reference aerial image may be generated by inserting one or more existing reticles in an aerial image defect detection and/or review tool with optical conditions set up to emulate the performance of a physical exposure system (scanner). Examples of aerial image defect detection and/or review tools are illustrated in commonly-assigned U.S. patent application Ser. No. 09/679,617 by Stokowski et al. filed on Oct. 6, 2003, which is incorporated by reference as if fully set forth herein.

The second simulated images may also be compared to different types of reference images. For example, a reference simulated image illustrating how the reticle will be printed on the wafer at nominal values of the one or more parameters of a wafer printing process is particularity useful for detecting defects in the reticle design data that will vary depending on the one or more parameters. In other words, such a reference image will be particularly useful for detecting defects in the reticle design data that may reduce the process window that can be used with the reticle. In particular, certain defects may not appear at the nominal parameters, but may appear in the second simulated images, particularly as the parameters move farther away from nominal. vPWQ may include determining, which of the different values at which at least one of the defects appears in the second image. Depending on the characteristics of these defects (e.g., whether the defects are "killer" defects or not and the values of the parameters at which these defects appear, the process window that can be used for the reticle in a wafer printing process may be less than the predetermined process window. In one embodiment, therefore, the method may include determining a process window for the wafer printing process based on results of the detecting step. The examination of the expected performance of the wafer printing process within the process window of the reticle is a particular strength of PWQ and vPWQ methods.

However, since such a reference image illustrates how the reticle design data would be printed on a wafer at nominal parameters, this comparison may not detect defects in the reticle design data such as features that will not print on a wafer at all. In particular, if there are features in the reticle design data that simply will not print these features will be missing from both the reference image simulated for nominal parameters and the second simulated images. Therefore, the missing features will not be detected by such comparisons. A reference image that represents the ideal image of the reticle design data, however, will include both printable and non-printable features. In this manner, comparison between such an "ideal" reference image and the second simulated images may be used to detect missing feature type defects. As such, multiple comparisons can be made between the second simulated images and different reference images to detect different kinds of defects thereby increasing the defect detection capability of the vPWQ methods.

As described above, defect detection may be performed by comparing test and reference images. Any region in the test image that varies from the corresponding region in the reference image by more than a threshold value is flagged as a defect. All of the algorithmic tools used in physical reticle inspection systems can be used in this defect detection step including varying the defect threshold based on local geometry, applying multiple algorithmic detectors based on different smoothing filters applied to varying numbers of nearest neighbor pixels, and detecting single edge misplacements (CD errors) and/or dual edge misplacements (registration errors).

The defect detection algorithms may have the same tuning capability as those used for physical reticle inspection tools. In particular, the algorithms that are used for the methods described herein may be configured such that the sensitivity of the algorithms can be optimized to detect defects which will impact device performance and yield, but not be overwhelmed by small differences between ideal and actual imaging performance. In one such embodiment, the sensitivity of the algorithms may be altered from region to region in the reticle design data based on one or more characteristics of the reticle design data (e.g., dimensions, criticality, etc.). In another such embodiment, the sensitivity of the algorithms may be altered dynamically or in real time based on the results of the detecting step. The sensitivity of the algorithm(s) may be altered in any manner known in the art (e.g., by altering the threshold used in the algorithm).

In one such embodiment, the methods described herein may be configured to perform defect detection with selective sensitivity, which is referred to herein as "SmartInspection." For example, defects may be identified by vPWQ by comparing simulated wafer images at different process conditions to a nominal or reference image. The sensitivity of this comparison directly affects the defect detection results of the vPWQ process. If the sensitivity is too high, every reticle design will fail since vPWQ will detect excessive numbers of defects. On the other hand, if the sensitivity is too low, potentially critical defects could escape detection. Examples of methods that can be used to implement SmartInspection are described in commonly-assigned U.S. patent application Ser. No. 10/883,372 to Volk et al. filed on Jul. 1, 2004, published as U.S. Patent Application Publication No. 2005/0004774, published on Jan. 6, 2005, which is incorporated by reference as if fully set forth herein. As described in this patent application, not all areas of a design are equally critical to device performance. In addition, if the designer tags individual portions of the reticle design data to indicate the most critical areas and/or the areas that do not matter to the device performance (dummy fill regions, redundant contacts, unconnected lies, etc.) the sensitivity of vPWQ can be varied on a localized basis to apply the maximum sensitivity to the most critical regions and reduced sensitivity to non-critical areas. Examples of such defect detection methods are also illustrated in commonly-assigned U.S. patent application Ser. No. 11/003,291 by Hess et al., filed on Dec. 3, 2004, published as U.S. Patent Application Publication No. 2006/0051682, published on Mar. 9, 2006, which is incorporated by reference as if fully set forth herein.

As described herein the method may include determining a process window for the reticle design data. The process window may include those values of the one or more parameters for which the second simulated images illustrate an acceptable level of defectivity. In addition, the methods described herein may include determining the sensitivity of different regions of the reticle design data to changes in the values of the one or more parameters. For example, in one embodiment, the method may include determining a region in the reticle design data in which the defects appear at the different values of the one or more parameters of the wafer printing process that are closer to nominal values for the one or more parameters of the wafer printing process than the different values at which the defects appear in other regions in the reticle design data. In other words, different regions may be identified in the reticle design data based on how quickly the regions exhibit detects as the parameter(s) move away from the nominal values. Such information may be used in a number of embodiments described herein. For example, this information may be used to tailor reticle inspection, wafer inspection, process control methods, etc. for a particular reticle design.

The methods described herein may also include generating an inspection process for the reticle based on results of the detecting step. In one such embodiment, another extension of the SmartInspection concept is to use the output of the vPWQ inspection to vary the sensitivity of the inspection of the fabricated reticle. In particular, the sensitivity of the reticle inspection can be higher in regions of the reticle design data where vPWQ results indicate the tightest process window, while the sensitivity can be lower in regions where vPWQ results indicate a more comfortable process window. Such reticle inspection methods are also described in the patent application by Hess et al., which is incorporated by reference above.

In another embodiment, the methods described herein may include generating an inspection process for the wafer based on results of the detecting step. In one such embodiment, the methods described herein may use the SmartInspection concept by using the output of the vPWQ methods to vary the sensitivity of the inspection of the printed wafer as a function of position on the wafer. In particular, the sensitivity of the wafer inspection can be higher in regions where vPWQ results indicate the tightest process window, while the sensitivity can be lower in regions where vPWQ results identify a more comfortable process window.

In an additional embodiment, the method may include fabricating the reticle subsequent to the detecting step (e.g., if the results of the detecting step indicate no significant or catastrophic defects in the reticle design data). This embodiment of the method may also include inspecting the reticle and generating an inspection process for the wafer based on results of the detecting step and the inspection of the reticle. In one such embodiment, the methods described herein may use the SmartInspection concept with the combined results of vPWQ and inspection of the fabricated reticle to determine the sensitivity of the inspection of the printed wafer as a function of position on the wafer. Thus, in regions of the reticle design data where the physical reticle inspection shows no problems and the vPWQ simulation predicts a relatively comfortable process window, the wafer inspection sensitivity can be relaxed. Sensitivity could be increased in regions where either vPWQ detected a restricted process window or reticle inspection found a less than optimal pattern where the departure from nominal is not large enough to be considered a defect, but may limit the process window ("subset region"). The highest sensitivity could be reserved for locations where both vPWQ and reticle inspection identified potential constraints on the process window. In some embodiments, the method may include generating an inspection process for the wafer based on results other detecting step of the vPWQ method, results of the reticle inspection, critical feature data generated by a designer of the reticle design data, or some combination thereof.

In additional embodiments, the method may include identifying first regions in the reticle design data that have a greater probability of being printed defectively than second or other regions in the reticle design data. One such embodiment may also include generating a process control method for wafers that will be printed with the reticle based on results of the identifying step. In this manner, the method may include determining the best wafer metrology sample plans for a particular reticle design. For example, extra care could be taken to measure locations on a wafer corresponding to the regions where vPWQ and/or reticle inspection identified limited process windows, and critical dimension (CD) measurements could be performed at those locations to insure that the device meets specifications. Extra care may also be taken in any other manner such as increasing the number and/or the sensitivity of the measurements performed in these locations.

In another example, identification of regions in the reticle design data with the most limited process windows as determined by vPWQ, reticle inspection, and/or physical wafer PWQ) can also be used to improve the CD control method or other metrology or process control method used in the fab. For example, instead of tracking and adjusting dose and focus to obtain the most stable CDs on test structures or other features, identification of the regions having the most limited process windows allows the control loops (statistical process control (SPC) and/or automatic process control (APC)) to be optimized to keep these locations from drifting outside of the allowed specification limits. The optimization of the control loops may include either a) shifting the metrology sample plan to measure specific features with the most limited process windows or b) measuring other features, determining thee focus and exposure conditions, which led to the printing of these test structure dimensions, and applying simulation to predict the expected results of the process window limited features at the determined values of focus and exposure. This optimization technique is an extension of the CD control technique described in commonly-assigned U.S. patent application Ser. No. 10/778,752 by Preil et al. filed on Feb. 13, 2004, which is incorporated by reference as if fully set forth herein.

In additional embodiments, the methods described herein may include altering the reticle design data based on the identifying step described above. For example, vPWQ output can be fed back up to the designer or the design process. The results can be used to determine the circuit timing, parasitics and electrical performance of a circuit that will be formed on a wafer that is printed with the reticle design data. The results can also be used to determine if the defects detected by vPWQ have characteristics such as size that will impact circuit performance. Currently, this physical (or electrical) verification is performed assuming that the ideal design as drawn by the layout tools is what will appear on the wafer. However, the vPWQ methods described herein can be used to identify the departures to be expected from this nominal case and to locate the regions of the circuit which will have the largest departure from nominal.

Obviously, using currently available hardware, it would not be practical to attempt to model the electrical performance of a circuit with millions of transistors while varying every single feature of the transistors across the full range of possible sizes. The vPWQ methods described herein, however, can reduce the number of points in the reticle design data that are varied and tested to a manageable number. Te designer or design process or tool can use this data and knowledge of which portions of the circuit are most critical to device performance to run a limited number of additional verifications prior to committing the design to a mask set.

Another aspect of vPWQ that differs from physical PWQ is the ability to flexibly change the simulation conditions during the virtual inspection. In particular, PWQ relies on physical wafers printed under preset conditions of focus and exposure. Since the number of such conditions for which images can be printed on a wafer is relatively limited, the data is highly granular (e.g., increments of focus of 0.1 μm) thereby possibly producing large changes in the number of defects from one setting to the next. However, vPWQ can change settings as it inspects (e.g., in real time as vPWQ is being performed). For example, if too many defects occur in one present focus or exposure increment, additional simulations can be run automatically to fill in the gap and determine the precise focus and/or exposure settings at which the defect began to print. vPWQ can, therefore, create far more precise maps of the allowed process window for each critical feature.

The vPWQ methods described herein can be used to detect defects in reticle design data for binary masks (chrome on glass (COG) masks) or masks with any of a number of RETs such as OPC, phase shifting masks (alternate aperture or embedded PSM (EPSM)), sub-resolution assist features (SRAFs) such as scattering bars, serifs, and hammerheads, chromeless phase shift masks (CPL), and gray scaled images. The vPWQ methods described herein can also be applied to complementary masks where the desired pattern is decomposed into multiple patterns, which are each imaged under different illumination conditions. For a complementary mask, the vPWQ methods include generating simulated images, each illustrating how the different, multiple patterns will be printed separately on a wafer by the different reticules. The vPWQ method may then use each of the simulated images in combination to generated additional simulated images (the test images) that illustrate how the final reticle design pattern will be printed on a wafer using a multiple exposure wafer printing process on the scanner.

The vPWQ methods described herein are equally applicable to optical lithography processes using visible, ultraviolet, and deep ultraviolet illumination (e.g., 248 nm, 193 nm, and 157 nm light sources), electron beam lithography, or extreme ultraviolet lithography using reflective masks and an exposure wavelength near 13 nm. The vPWQ methods may also be applied to mask less lithography systems where reticle inspection is not possible. In this case, the vPWQ inspection has the added advantage of minimizing the need for difficult die-to-database inspection at the wafer level.

The methods described herein have, therefore, a number of advantages over other reticle design data inspection methods. For instance, the methods described herein can be used for detecting and correcting process window marginalities in the reticle design data prior to manufacturing the masks and printing wafers. As such, the reticle design data inspection methods described herein are substantially less expensive than currently available methods. In addition, the mask making process and the wafer pattern transfer process are simulated. Therefore, the methods described herein account for how the reticle design data will be altered by the reticle manufacturing process and the wafer printing process. For the designer, vPWQ offers the ability to test multiple variations of a design without buying multiple variations of expensive masks. The designer may, therefore, select the reticle design implementation with the broadest process window to maximize device yield in production. vPWQ also provides the ability to generate reticle inspection, wafer inspection, and CD metrology and process control methods having selective sensitivity (sample plans, process window centering, and maximizing the available process window for production). Furthermore, the vPWQ method results may be used for optimization of the circuit design (e.g., optimization of one or more characteristics of the circuit design such as timing, parasitics, other electrical parameters, or some combination thereof).

One preferred embodiment of the wafer level simulation includes simulation of the aerial image (reticle manufacturing process), resist process (wafer printing process), and etch process to determine the final physical pattern that would be formed on the wafer. Alternative methods include aerial image simulation only; aerial image simulation with an adjustable threshold model calibrated to emulate the real photoresist performance as a function of CD, pitch and local environment; and aerial image simulation with an adjustable threshold calibrated to emulate the pattern transfer after resist processing and etch as a function of CD, pitch, and local environment.

The simulation at the wafer level can include, therefore, not just the lithography (wafer printing) process, but the full pattern transfer process, including any, some combination, or all of the following: etch, polishing, film deposition or growth, and any other steps that affect the final structure and topography of the device. Lithography parameters for which simulated images may be generated at different values can also include degree of partial coherence, illumination mode, numerical aperture, lens aberrations (e.g., Zernike coefficients), resist parameters (e.g., thickness, development rate model, lumped parameter model, Dill coefficients, and thermal diffusion coefficients) and/or film parameters (e.g., substrate reflectivity, thickness, anti-reflection coating properties, etc.).

The simulation at the wafer level can also include electrical simulation of device performance in addition to physical simulation of the patterned structures. The electrical performance of the device—either parametric properties of selected regions of the circuit (e.g., resistance, capacitance, transistor performance, etc.), performance of localized regions of the circuit (e.g., phase lock loop frequencies, timing, etc.), or the simulated performance of the full circuit as intended in the end use application—can be used as the pass/fail criteria for the design and/or to select critical regions for further inspection, metrology, and/or process control. In one embodiment, the method may include altering the reticle design data based on results of the vPWQ method. In one such embodiment, the reticle design data may be altered by altering RET feature data of the reticle design data.

The simulation of the reticle design data printed on a wafer can be performed using parameters of multiple, different reticle manufacturing processes, and the simulation of the wafer printing can be performed using parameters for multiple, different exposure tools, etch tools, or other processes. Examination of the reticle design data for different processes and tools may be valuable since each tool or process will have different aberrations that impact the pattern transfer in different ways. The vPWQ simulations can then be used to determine the optimum combination of design, optical enhancements (e.g., OPC, RET, etc.), mask making process, and wafer manufacturing process. In one such embodiment, the method may include generating additional simulated images illustrating how the reticle design data will be printed on the reticle at different values of one or more parameters of the reticle manufacturing process. Such embodiments may also include selecting the different values of the one or more parameters of the reticle manufacturing process that produce a minimum number of design pattern defects on the reticle.

The vPWQ concept and data linkages to reticle and wafer inspection, CD control, and design optimization cant also be performed using printed wafers based on die-to-database inspection. Although performing such printed wafer inspection involves making a reticle and printing wafers, such an embodiment of the vPWQ methods would still add value to the integrated circuit manufacturing process.

A system configured to perform the vPWQ methods described herein may appear to be similar to a state of the art KLA-Tencor reticle inspection system, but optionally without the reticle handling and optical systems. Such a system may include a user interface that can be used to define the inspection parameters and a computer system to handle the incoming reticle design data and render the simulated mask level from the data (i.e., to generate the first simulated image as described, above). The system may also include a massively parallel computer system to simulate the mask to wafer pattern transfer under a range of focus and/or exposure conditions (i.e., to generate the second simulated images as described above).

If the second simulated images are generated for different values of focus and exposure of a wafer printing process, one or more of the computer systems described above may be configured to compare reference and test images for the full chip for each focus-exposure (F-E) combination and to identify locations that are defects under the conditions set in the inspection recipe. These defect locations may be compared between F-E settings, and defects that occur at the same location under multiple F-E conditions can be concatenated to a single defect. Each defect may be tagged with the range of focus and exposure conditions under which it prints as a defect in the simulated images. The detects may then be automatically prioritized for review and analysis. The highest priority would be assigned to those defects which occur closest to the nominal F-E conditions and/or those with the most limited range of non-defectiveness. A defect map may be presented to the user or review and classification, and an inspection report may be generated and stored for later review and/or additional analysis, either on-line (linked to the simulation engine) or off-line.

With the trend towards fabless design companies feeding their products to multiple foundries, the number of designs which can be verified using the vPWQ methods described herein is growing rapidly. Foundries may use multiple vPWQ tools to qualify all of their designs in a timely manner, as will IDMs with a wide range of products (telecommunications, wireless, consumer applications). In addition, the methods described herein may be performed using hardware that is similar to that used in currently available reticle inspection systems such as the TeraScan system, which is commercially available from KLA-Tencor. In this manner, the methods described herein can be implemented without substantial development costs and may be made commercially available on currently available reticle inspection systems. Furthermore, the methods described herein may be performed on hardware that is linked to reticle inspection, wafer inspection, metrology and analysis tools such that data may be easily shared between systems.

FIG. 1 is a flow chart illustrating one example of a method for detecting defects in reticle design data. This method includes designing the circuit, as shown in step 10 of FIG. 1. The circuit may be designed using any method or system known in the art. The method also includes verifying the design, as shown in step 12. Verifying the design may include verifying the physical characteristics of the design. The physical verification can be performed using any method or system known in the art. As shown in step 14, the method includes determining if the circuit design passes or fails the physical verification. If the design fails the physical verification, the method includes re-designing the circuit and repeating the physical verification, which may include repeating steps 10, 12, and 14.

If the design passes the physical verification, the method includes generating a layout for the circuit, as shown in step 16. The layout of the circuit may be generated using any method or system known the art. The method also includes verifying the layout of the circuit, as shown in step 18. The verification of the layout may include local verification and/or design rule checking (DRC). The layout verification can be performed using any method or system known in the art. As shown in step 20, the method includes determining if the layout passes or fails verification. If the layout fails verification, the method includes changing the layout of the circuit and re-verifying the revised layout of the circuit, which may include repeating steps 16, 18, and 20.

If the layout passes verification, the method includes adding RETs to the circuit layout, as shown in step 22. This step is commonly referred to as "decorating" the circuit layout. Adding the RETs to the circuit layout may be performed in any manner known in the art. The RETs may include any RET known in the art. As shown in step 24, the method includes verifying the decoration. Verifying the decoration may include optical rule checking (ORC). As shown in step 26, the method includes determining if the decorated layout passes or fails verification. If the decorated design fails verification, the method includes changing the RETs in the decorated design and re-verifying the decorated design, which may include repeating steps 22, 24, and 26.

If the decorated design passes verification, the method includes making the mask, as shown in step 28. As shown in step 30, the method includes verifying the mask using mask inspection. The mask may be inspected using any system and method known in the art. As shown in step 32, the method includes determining if the mask passes or fails verification. If the mask fails inspection, the method includes determining it the mask is repairable, as shown in step 34. If the mask is determined to be repairable, the method includes repairing the mask, as shown in step 36, and then re-verifying the repaired mask, which may include repeating steps 30 and 32. If the mask is determined to not be repairable, the method includes scrapping the mask and optionally re-spinning the process, as shown in step 38.

If the mask passes verification, the method includes printing wafers, as shown in step 40. As shown in step 42, the method includes verifying the printed wafers. In one example, verifying the printed wafers may, include PWQ wafer inspection, which may be performed as described above. As shown in step 44, the method includes determining if the printed wafers pass or fail verification. If the wafers fail inspection, the method includes determining if the defects in the reticle that caused the wafers to fail inspection can be repaired, as shown in step 46. If the defects of the reticle are repairable, the method includes repairing the mask, as shown in step 36, and the method may be continued after step 36 as shown in FIG. 1. If the defects on the reticle are determined to not be repairable, the method includes scrapping the mask and optionally re-spinning the process, as shown in step 38. If the wafers are determined to pass verification, the method includes releasing the reticle to production, as shown in step 48.

Figure 2:
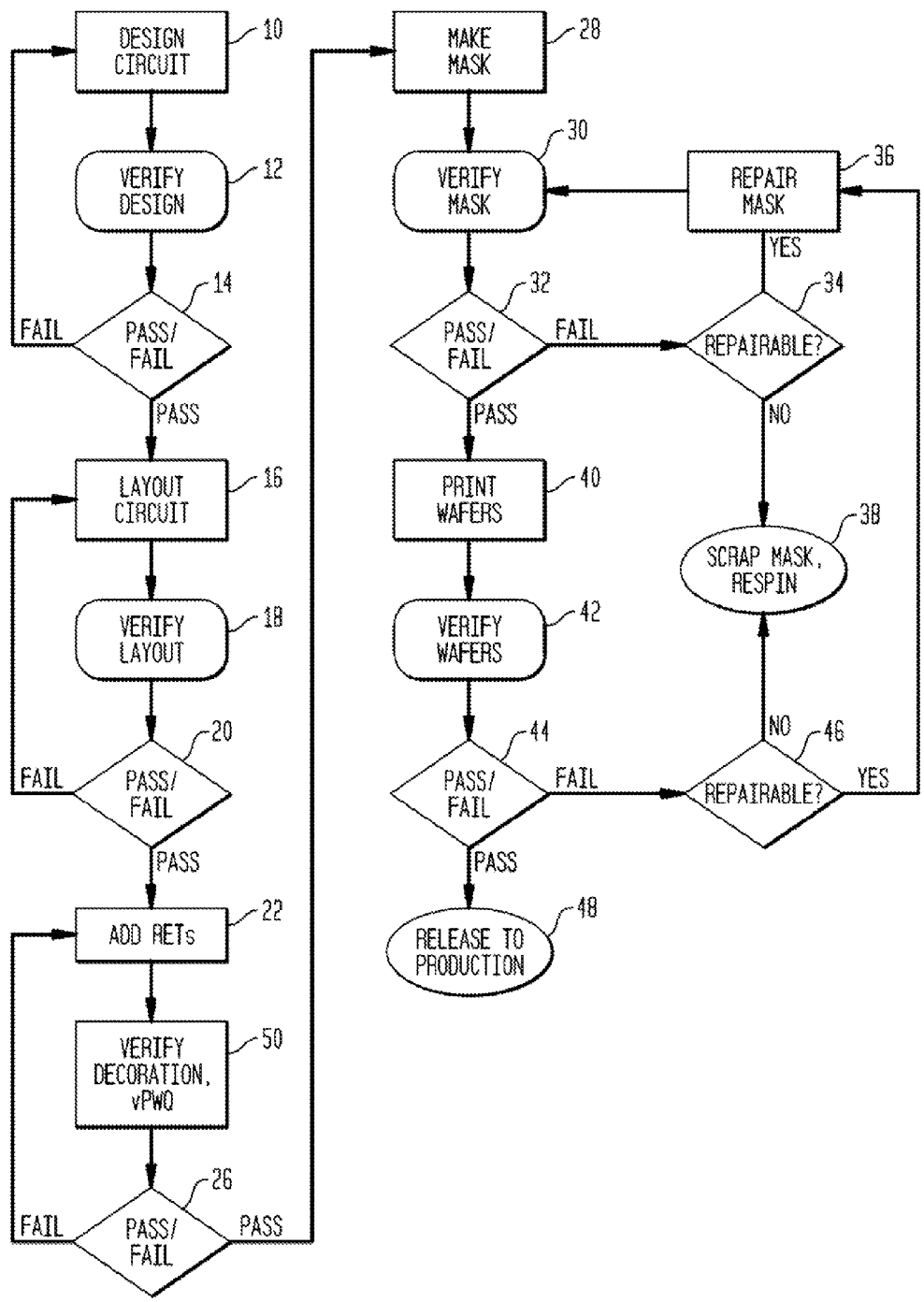
FIG. 2 is a flow chart illustrating one embodiment of a computer-implemented method for detecting defects in reticle design data.

In the method shown in FIG. 1, any RET process window marginalities or any other reticle design defects are not detected until a wafer is printed. As such, if defects or marginalities are present in the reticle pattern, it is relatively expensive to scrap the printed wafer and to revise the parameters involved in one or more processes of the wafer print process (e.g., reticle design, reticle manufacturing process, wafer printing process, etc.). FIG. 2 is a flow chart illustrating one embodiment of a computer-implemented method for detecting defects in reticle design data. This method may, or may not, include many of the steps described and shown in FIG. 1. Those steps that may be included in both FIGS. 1 and 2 have been indicated using the same reference numerals and will not be described further herein. However, the method shown in FIG. 2 includes one important step that is not included in FIG. 1, which impart significant advantages to the method shown in FIG. 2.

In particular, the method shown in FIG. 2 includes verifying the decoration of the reticle design as shown in step 50, which unlike step 24 of the method shown in FIG. 1 includes vPWQ defect detection. vPWQ in step 50 may be performed as described herein. In addition, the vPWQ method performed in step 50 may be performed to detect defects in the reticle design data across a full predetermined process window for the wafer printing process that is to be used with the reticle. As such, in this method, any marginalities that are present in the reticle design can be advantageously detected before the mask is fabricated. The method shown in FIG. 2 may include any other steps described herein. For example, the method shown in FIG. 2 may include generating an inspection process for the reticle and/or generating an inspection process for the wafers. These inspection processes may be generated as described above and may be used in steps 30 and 42 to verify the reticle and wafers, respectively.

Figure 3:
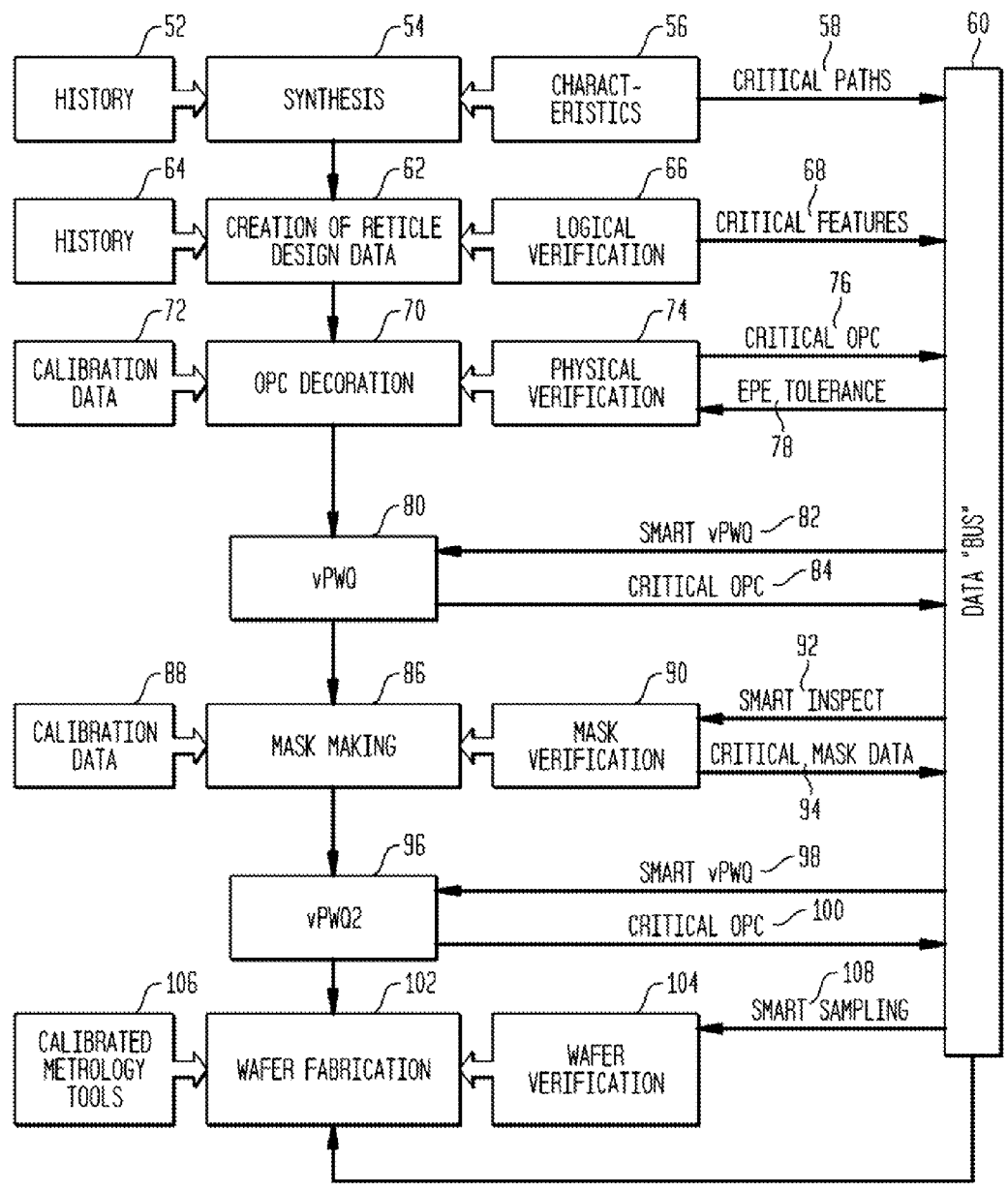
FIG. 3 is a flow chart illustrating one embodiment of a method for data flow between a computer-implemented method for detecting defects in reticle design data and other process steps.

FIG. 3 is a flow chart illustrating examples of data flow between vPWQ and one or more of wafer inspection, reticle inspection, wafer metrology, and APC control in the fab. As shown in FIG. 3, history 52, which includes prior designs and models may be provided to synthesis step 54 in which the design may be created in an appropriate format such as RTL code or netlist format. Characteristics 56 of the integrated circuit such as timing, power, and signal integrity may be provided to the synthesis step to verify the design. Critical paths 58 in the design determined by verification can be provided to data "bus" 60.

Creation of the reticle design data may be performed in step 62. Creation of the reticle design data may include, for example, converting the netlist to GDS format. History 64 including, for example, prior designs and/or models may be provided to the creation step. In addition, logical verification step (LVS) 66 may be used to verify the reticle design data. Critical features 68 in the reticle design determined by LVS may be provided to data "bus" 60. OPC decoration of the reticle design maya be performed in step 70 using calibration data 72 such as calibrated lithography models, critical dimensions, and/or other data. Decoration may include adding any RETs to the reticle design data. Physical verification step 74 may include verifying the decorated reticle design using a technique such as ORC. Critical OPC 76 or other critical RET determined by the physical verification step may be provided to data "bus" 60. In addition, physical verification step 74 may be performed using edge placement error (EPE) tolerance data 78 provided by data "bus" 60.

As shown in FIG. 3, after OPC decoration of the reticle design data, vPWQ defect detection may be performed in step 80. vPWQ may be performed in step 80 according to any of the embodiments described herein. One or more parameters for "Smart vPWQ" 82 may be provided to the vPWQ method by data "bus" 60. vPWQ may generate critical OPC information 84, which is provided to data "bus" 60. Depending on the results of the vPWQ method, mask making step 86 may be performed using calibration data 88 such as PSC, BKMs, aerial imaging measurement system (AIMS) calibration data, etc. After the mask is fabricated, mask verification step 90 may be performed on the mask fabricated in step 86. Mask verification step 90 may use SmartInspection data 92, which may be provided by data "bus" 60. This SmartInspection data may be generated by the vPWQ method performed in step 80. In addition, critical mask data 94 generated by the mask verification step may be provided to data "bus" 60.

In some embodiments, a second vPWQ method (vPWQ2) may be performed, as shown in step 96. vPWQ2 shown in FIG. 3 is an alternate embodiment of vPWQ that can be performed after mask inspection on real mask images (i.e., images of the fabricated reticle). In other words, vPWQ2 may be performed as described herein except with real mask images instead of simulated images of the reticle. vPWQ2 may be performed using one or more parameters for "Smart vPWQ" 98 from data "bus" 60. "Smart vPWQ" parameters 98 may or may not be the same as "Smart vPWQ" 82. Critical OPC 100 or other critical RET generated by vPWQ2 may be provided to data "busy" 60.

Wafer fabrication step 102 may be performed after vPWQ2. Verification of the wafer fabrication step 104 may be performed using calibrated metrology tools 106, which may include any metrology tools known in the art. Verification of the wafer fabrication step 102 may be performed using "Smart Sampling" parameters 108 for the wafer inspection provided by data "bus" 60, which may be determined from, for example, critical paths 58, critical features 68, mask location data, critical OPC 76 and 100, etc. In addition, verification of the wafer fabrication step may be performed using APC 110 information provided by data "bus" 60. APC information may be generated from the results of vPWQ and/or vPWQ2 as described herein.

Figure 4:
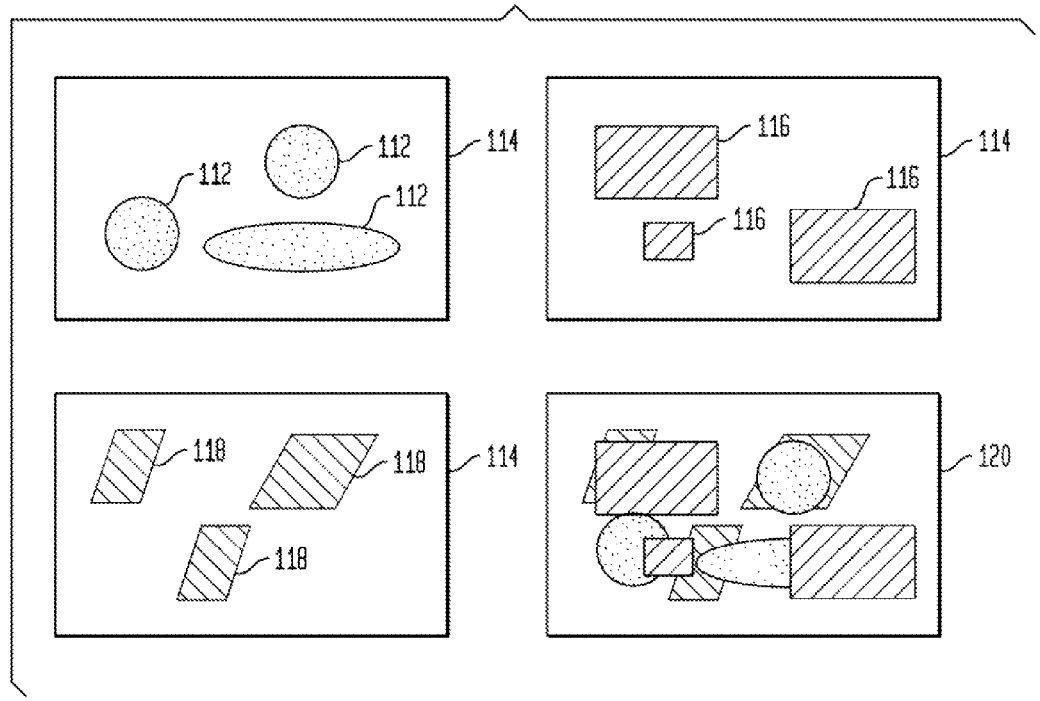
FIG. 4 is a schematic diagram illustrating one example of different areas in reticle design data having different levels and types of criticality.

FIG. 4 illustrates how multiple types of criticality (design, RET, mask making) may overlap in reticle design data such that patterns may suffer most at margins of the process window, which may limit the available process margin. In particular, design critical areas 112 are shown mapped in space 114, which represents the area of the reticle design data. Design critical areas 112 may be created or "tagged," for example, by a designer based on electronic design automation (EDA) electrical simulation. In contrast, mask making critical areas 116 are shown separately in space 114. The mask making critical areas include regions with limited process window for the reticle manufacturing process. These critical areas may be created or "tagged" by the reticle inspection system used to inspect a fabricated reticle. More preferably, these critical areas may be determined by the vPWQ methods described herein.

Lithographic critical areas 118 are also shown separately mapped in space 114. The lithographic critical areas may include regions with limited process window for the wafer printing process. The lithographic critical areas may be identified and "tagged" by vPWQ simulation of the patterning process, which may be performed as described herein. It is to be understood that critical areas 112, 116, and 118 shown in FIG. 4 are merely presented as examples of the different critical areas. Obviously, the critical areas will vary depending on the reticle design data, the reticle manufacturing process, the wafer printing process, or some combination thereof.

Each of the critical areas described above may be combined in a single map as shown by space 120 to illustrate which areas in the reticle design data have multiple types of criticality. Areas that are critical for multiple reasons may be selected for intensive metrology and/or wafer level inspection to ensure yield. In particular, an inspection process for a reticle or wafer may be generated as described above, and the sensitivity of the inspection processes may vary from region to region in the reticle design data depending on the one or more reasons that each region qualifies as critical. For example, areas that exhibit two different types of criticality may be inspected with greater sensitivity than areas that exhibit only one type of criticality. In this manner, regions in the reticle design data with multiple types of criticality can be prioritized for wafer inspection, metrology, and CD control.

Additional methods described further herein may be used in the vPWQ methods described above and possibly in other reticle design defect detection methods. In particular, the methods described further herein provide improved methods for performing defect detection and other calculations described herein to reduce the number of detected defects which are not critical or important to the user to prevent the detection of these "nuisance" defects from obscuring the important defects. Additionally, the methods described further herein can be used to prioritize the order in which defects are reviewed and/or corrections are made to the design to improve the process window.

vPWQ was conceived to work just like PWQ, which is a wafer based inspection method disclosed in the patent application by Peterson et al., which is incorporated by reference above. On the wafers in PWQ, full fields are exposed at different focus and/or exposure conditions, and these test fields are compared to reference fields, which are exposed at best focus and exposure conditions. In general, the farther removed the test fields are from the reference fields, the more defects will be detected as printed features begin to fail to image properly. The focus and exposure conditions at which printed features image incorrectly thus define the limits of the usable process window for the device. vPWQ does essentially the same test to reference comparison, but on simulated images without making a mask and printing wafers. Therefore, the vPWQ method allows weak points in the reticle design to be identified and corrected before expensive masks are made and wafers are printed with the masks.

In performing a highly sensitive test-to-reference comparison, even small changes in the dimensions of the features may be interpreted as defects. As the focus and/or exposure conditions move away from the nominal best settings, the number of defects detected may become excessive. This problem can be mitigated by reducing the sensitivity of the inspection (test-to-reference comparison), but in that case some important defects may be missed.

It would be desirable to maintain the highest degree of sensitivity, but prioritize the defects based on the likelihood that they will lead to catastrophic imaging failures, not just small CD errors. In other words, the important information may not be which features have changed by a few nanometers (nm) in CD. Instead, the important information is which features will change by an unacceptably large number of nm if there is a small change in focus and/or exposure and/or other process conditions. Thus, two features may have exactly the same absolute CD error, but one feature may be far more important than the other if it is susceptible to large additional changes with additional process variation. Therefore, wafer based PWQ and vPWQ described above may be modified as described further herein to discriminate between potential defects based on rate of change.

In particular, one embodiment of a computer-implemented method for detecting defects in reticle design data includes generating a first simulated image illustrating how the reticle design data will be printed on a reticle using a reticle manufacturing process. This generating step may be performed as in the vPWQ methods described above. This embodiment also includes generating second simulated images using the first simulated image, which may also be performed as in the vPWQ methods described above. In particular, the second simulated images illustrate how the reticle will be printed on a wafer at different values of one or more parameters of a wafer printing process. However, unlike the vPWQ methods described above, this embodiment includes determining a rate of change in a characteristic of the second simulated images as a function of the different values. In addition, the method includes detecting defects in the reticle design data based on the rate of change. In some embodiments, the detecting step may include using the rate of change in combination with the second simulated images to detect the defects in the reticle design data. For example, defect detection may be performed using rate of chance in combination with the vPWQ results described above. These embodiments of this computer-implemented method may include any other step(s) described herein.

Another embodiment of a method for detecting defects in reticle design data printed on a reticle is a modified version of PWQ that includes printing images of the reticle on a wafer at different values of one or more parameters of a wafer printing process. The method also includes determining a rate of change in a characteristic of the images as a function of the different values. In addition, the method includes detecting defects in the reticle design data based on the rate of change. This embodiment of the method may include any other step(s) described herein.

The methods described herein, therefore, may include using not just the difference between the test CD and the reference CD to detect defects in the reticle design data as in vPWQ and PWQ, but also the rate of change of the test CD. Such defect detection can be accomplished in several ways, and the results can be used in several different ways, which are outlined below. The different methods of computing and using rate of change information can be used separately or in combination with each other as outlined below. In addition, although methods are described herein with respect to the rate of change in CD, it is to be understood that the rate of change information may be the rate of change in any measurable parameter of the test images (e.g., feature profile). Furthermore, although methods are described further herein with respect to different values of focus and exposure of a wafer printing process, it is to be understood that the methods described herein can be used for different values of these and/or any other parameters of the wafer printing process that may affect the reticle design data printed on the wafer.

One method of increasing vPWQ and PWQ sensitivity to rate of CD change is to change the reference used in defect detection. For example, instead of using the reference image simulated for nominal best focus and exposure conditions ($E_0$, $F_0$) as the reference for all comparisons with test images, each test image ($E_n$, $F_n$) can be compared to its nearest neighbors (e.g., other test and/or reference images that are closer to the nominal values at ($E_0$, $F_0$) than the test image). In other words, the detecting step of vPWQ may be performed by comparing one of the second or test simulated images to additional simulated images that illustrate how the reticle will be printed on the wafer at the different values that are closer to nominal values for the one or more parameters of the wafer printing process than the different values corresponding to the one second simulated image.

Figure 5:
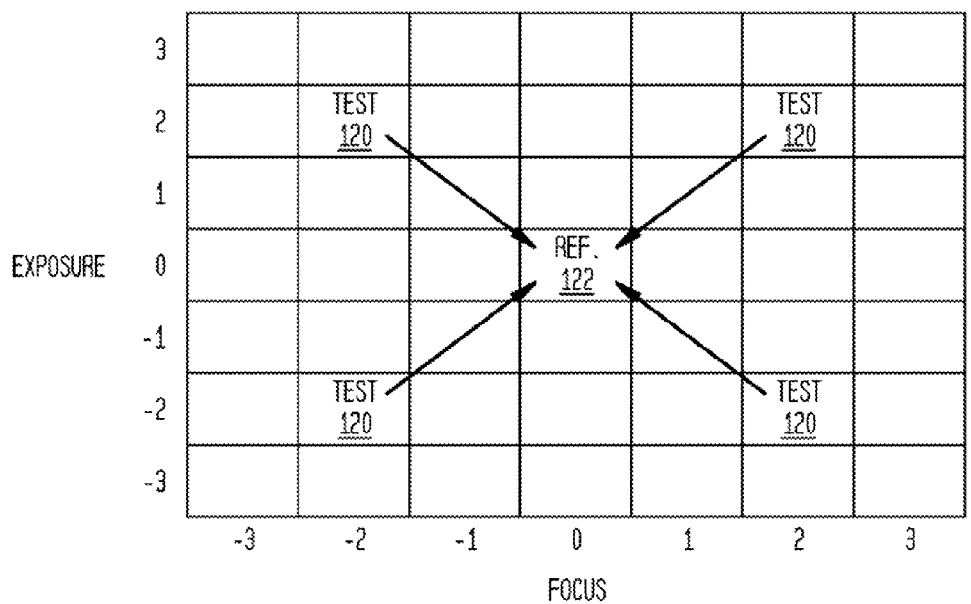
FIG. 5 is a schematic diagram illustrating one example of different values of parameters of a wafer printing process for which simulated images can be generated, which can be used to detect defects in reticle design data.

FIG. 5 shows one example of a layout that is currently used for defect detection in which each test image ($E_n$, $F_n$) is compared to the same nominal reference image ($E_0$, $F_0$). In particular, test images 120 are each compared to reference image 122. Such comparisons may be used for PWQ with images actually printed on a wafer. Alternatively, such comparisons may be used for vPWQ with simulated test and reference images. It is to be understood that although four test images are shown in FIG. 5, the defect detection method may use any number of test images.

Figure 6:
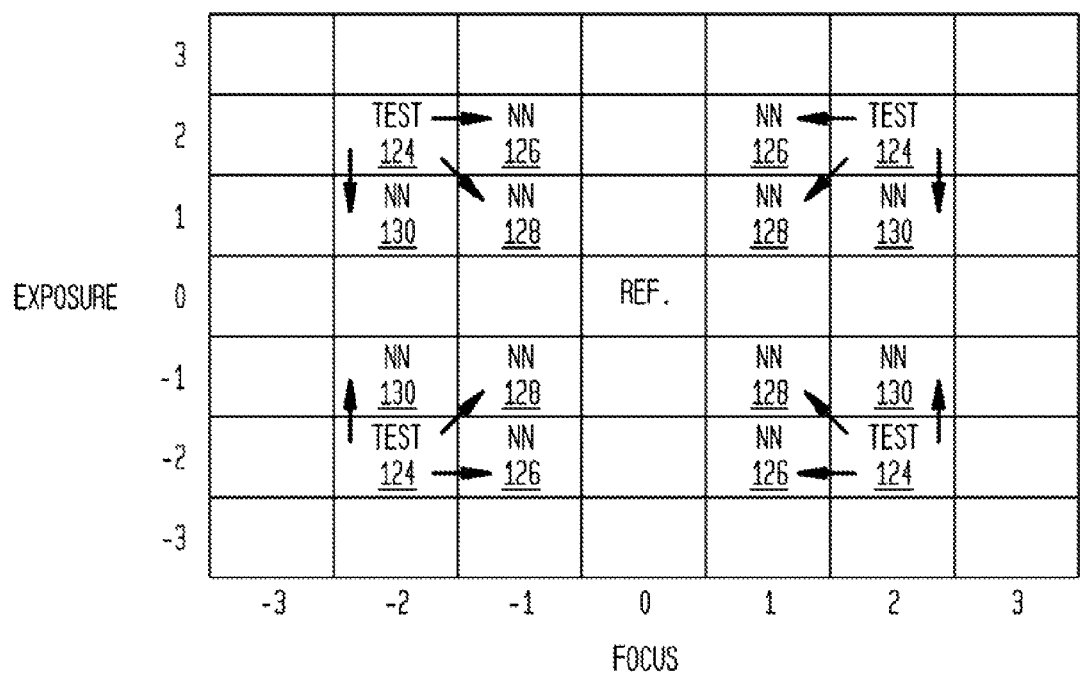
FIG. 6 is a schematic diagram illustrating one embodiment of different values of parameters of a wafer printing process for which simulated images can be generated, which can be used to detect defects in reticle design data.

FIG. 6 shows a new arrangement that can be used for different reticle defect detection in which each test image ($E_n$, $F_n$) 124 is compared to its 3 nearest neighbors (NN) 126, 128, and 130, all of which are simulated or printed for at least one parameter that is closer to the nominal values ($E_0$, $F_0$) than the test image. Such comparison of test and reference images is referred to herein as "cascading" test to reference defect detection. Such comparisons can be easily performed for vPWQ using images simulated for the different values of exposure dose and focus. This method can also be applied to wafer based PWQ by printing the wafer in an appropriate manner (e.g., by adding columns with offset focus and exposure conditions to be used as reference sites instead of the current configuration where all reference columns are exposed at nominal conditions).

In the example of FIG. 6, the 3 nearest neighbors are each used for comparison with the test image. Alternatively, the number of neighbors used for comparison with the test image could vary from 1 to 8. For one comparison, the user may select the nearest neighbor in terms for focus or exposure with the other parameter fixed or may select the diagonal nearest neighbor for which both focus and exposure changed. For more than 3 nearest neighbors, the test images that are farther removed from the nominal best focus and exposure conditions may be compared to the test image being examined thereby sampling the rate of change moving away from the preferred operating conditions. Although one or more of the comparisons are redundant (since a comparison would be repeated for the inspection of the outward neighbor), different weighting factors could be applied in the defect detection and/or prioritization algorithms. In addition, although 4 test images are shown in FIG. 6, it is to be understood that the methods described herein may use any number of test images for defect detection.

Figure 7:
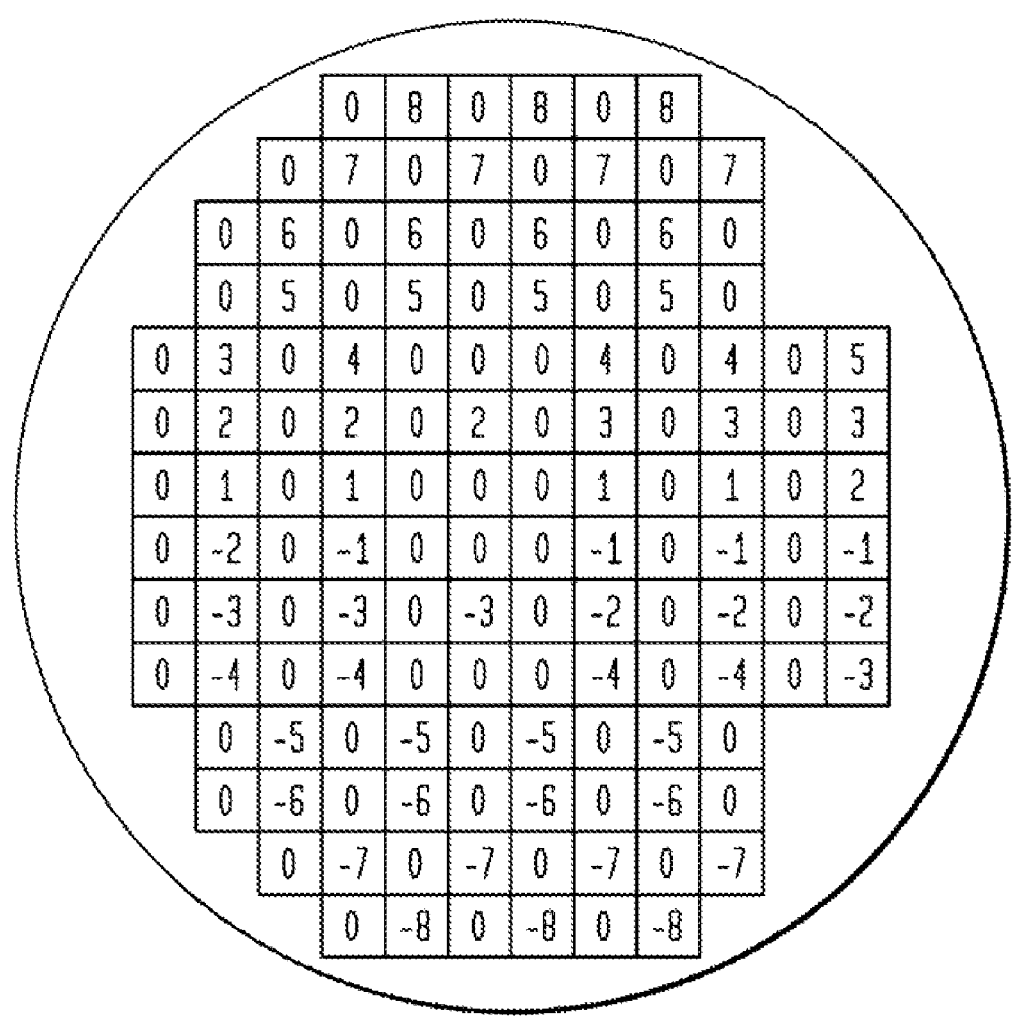
FIG. 7 is a schematic diagram illustrating one arrangement of dies printed on a wafer at different values of parameters of a wafer printing process that can be used to detect defects in reticle design data.

FIG. 7 illustrates one layout for dies printed on a wafer that can be used for PWQ defect detection. In this example, each test location is compared to a nominal reference image corresponding to best focus and exposure values for the wafer printing process, which are indicated in FIG. 7 by a 0. Each set of test conditions is checked 4 times in this arrangement. A test condition can vary in focus, exposure, or both.

Figure 8:
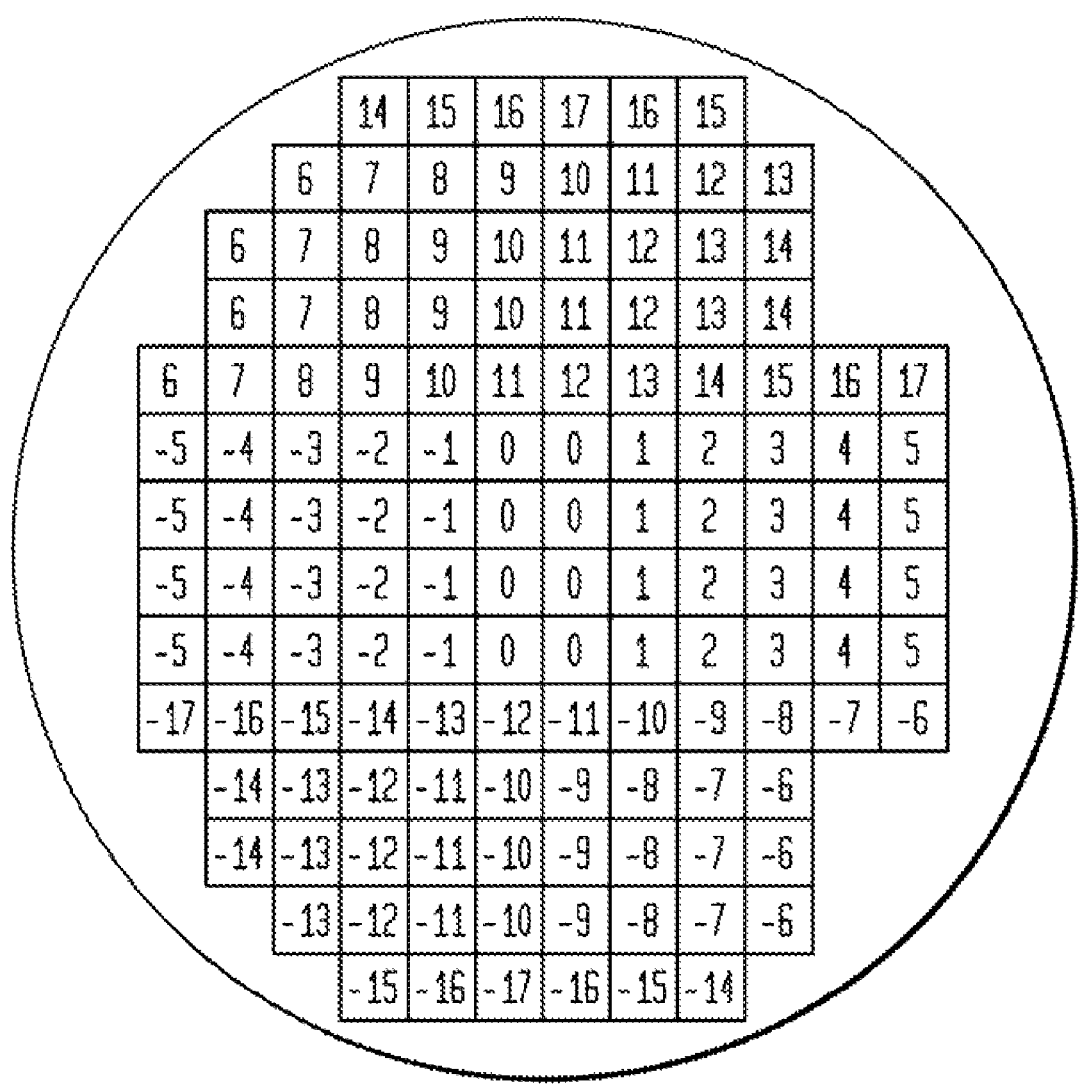
FIG. 8 is a schematic diagram illustrating one embodiment of an arrangement of dies simulated or printed on a wafer at different values of parameters of a wafer printing process that can be used to detect defects in reticle design data.

FIG. 8 illustrates one layout of die images that can be printed on a wafer for different values of focus and exposure for PWQ defect detection or that can be simulated for the different values of focus and exposure for vPWQ defect detection. In this example, each test image is compared to another test image that is printed or simulated for value(s) of the wafer printing process parameter(s) that are closer to the nominal values than those of the test image being examined. Each test image may still be compared 4 times, as in FIG. 7 but far more values of the parameters can be tested with more sensitivity to the rate of change between settings. Some replication of the nominal conditions (0) may be printed on the wafer for calibration and background noise checks.

By performing such cascading test to reference defect detection, the defect detection algorithms will detect areas that are the most different from the neighboring exposure conditions (focus and/or exposure) thereby increasing the sensitivity of the inspection to the local rate of change in the CDs. Even if two test images have the exact same change in CD relative to the nominal conditions, if the CD of one of the test images changed slowly over multiple values of the parameters while the CD of another test image changed quickly between the most recent reference focus and the current test focus, the sensitivity of the inspection can be tuned to detect the CD of the test image that changed the quickest, and which is therefore likely to be most important to the user. For cases where the test image is compared to multiple reference images. weighting factors can be applied to the multiple comparisons to arrive at a final defect score. The final defect score can be used to determine if a test image is defective or not and to prioritize the effective size of the defect.

In addition, since the vPWQ method is based on simulation, vPWQ can be used to more accurately determine the rate of change of the CDs as a function focus and/or exposure (the "exposure conditions"). The determination of the rate of change can be performed in several ways. The most accurate method would be to compute the true derivative of the Cd, dCD/dE and dCD/dF, for each feature at each combination of exposure conditions. Another method is to compute the slope of the aerial image, dE/dx, or the normalized image log slope (NILS) at the threshold energy for each feature and combination of exposure conditions ($E_{th}$). The smaller the slope or NILS, the more rapidly the CD will change with a change in exposure or process conditions. Therefore, this slope can be taken as an indication of the rate of change of the CD.

The slope or derivative data can be used independently as the sole criteria for determining if a feature is defective or not, or the slope and derivative can be used together with the test to reference comparison to prioritize the importance of the defects detected by the comparison algorithms. Similarly, the cascading test to reference comparison can be used independently, or in combination with, the test to nominal reference comparisons described above. These possible combinations allow the defects to be detected and/or prioritized based on the size of the defect alone, the rate of change of the defect alone, or a combination of size and rate of change. Weighting factors can be applied to the multiple terms used in this comparison to filter and/or prioritize defects. The weighting factors can be linear or non-linear, and the weighting algorithm can include cross-terms or higher power coefficients of the inputs. For example, the weighting for a 2 nm CD error could vary depending on whether the rate of change of the CD is high or low, while on the other hand, the weighting for a 10 nm CD error can be set to be high regardless of the rate of change.

Any of the options described above can be used independently or in combination. For clarity, the possible options are numbered, and the combinations of the options that would enhance the value of the inspection are listed below.

Option 1: Test to reference comparison with the reference always at the nominal operating point;

Option 2: Compute derivatives of the CD with respect to dose and/or focus;

Option 3: Compute the spatial derivative of the aerial in and/or NILS; and

Option 4: Cascading test to reference comparisons.

Option 1 alone is essentially the same as the comparison that may be performed in the defect detection step of vPWQ and PWQ. Options 2, 3, or 4 could each be used independently in place of Option 1. The interesting combinations are then:

Options 1 and 2; 1 and 3; or 1, 2, and 3;
Options 4 and 2; 4 and 3; or 4, 2 and 3;
Options 1 and 4; 1, 4, and 2; 1, 4, and 3; or
all 4 options together.

In any of these combinations, the different options can have a greater or lesser influence on the defect filtering or prioritization depending on the weighting factors that are applied.

The use of CD rate of change information in addition to absolute CD error data as described above allows improved detection of regions of the design and/or reticle that will be most prone to process window limiting failures and pattern dependent yield loss. The rate of change data allows for higher sensitivity to be applied to the inspection (either physical or virtual), without flooding the detection system with an impractically large number of defect detections, thus enhancing the usable sensitivity of the system.

Derivatives generally cannot be readily computed from physical wafers used for wafer based PWQ, but the normal test to reference and cascading, test to reference comparisons can also be combined for enhanced PWQ. In one example, instead of the current BABA or BBABBA layout, where B is the reference at nominal best focus and exposure and A is the test case, a cascading approach would have a layout with an ABCDEFGH pattern, where each exposure would have it's settings offset sightly from the previous field, making this layout more sensitive to small changes in pattern fidelity vs. process conditions. This layout also provides more possible test conditions on a wafer. For arbitration purposes, the defect would be assigned to the field with settings farthest from nominal. Any random errors caused by this rule would simply be removed when stacking the multiple replications of each set of test conditions. The same concept can be applied to the BBA type arrangement.

Figure 9:
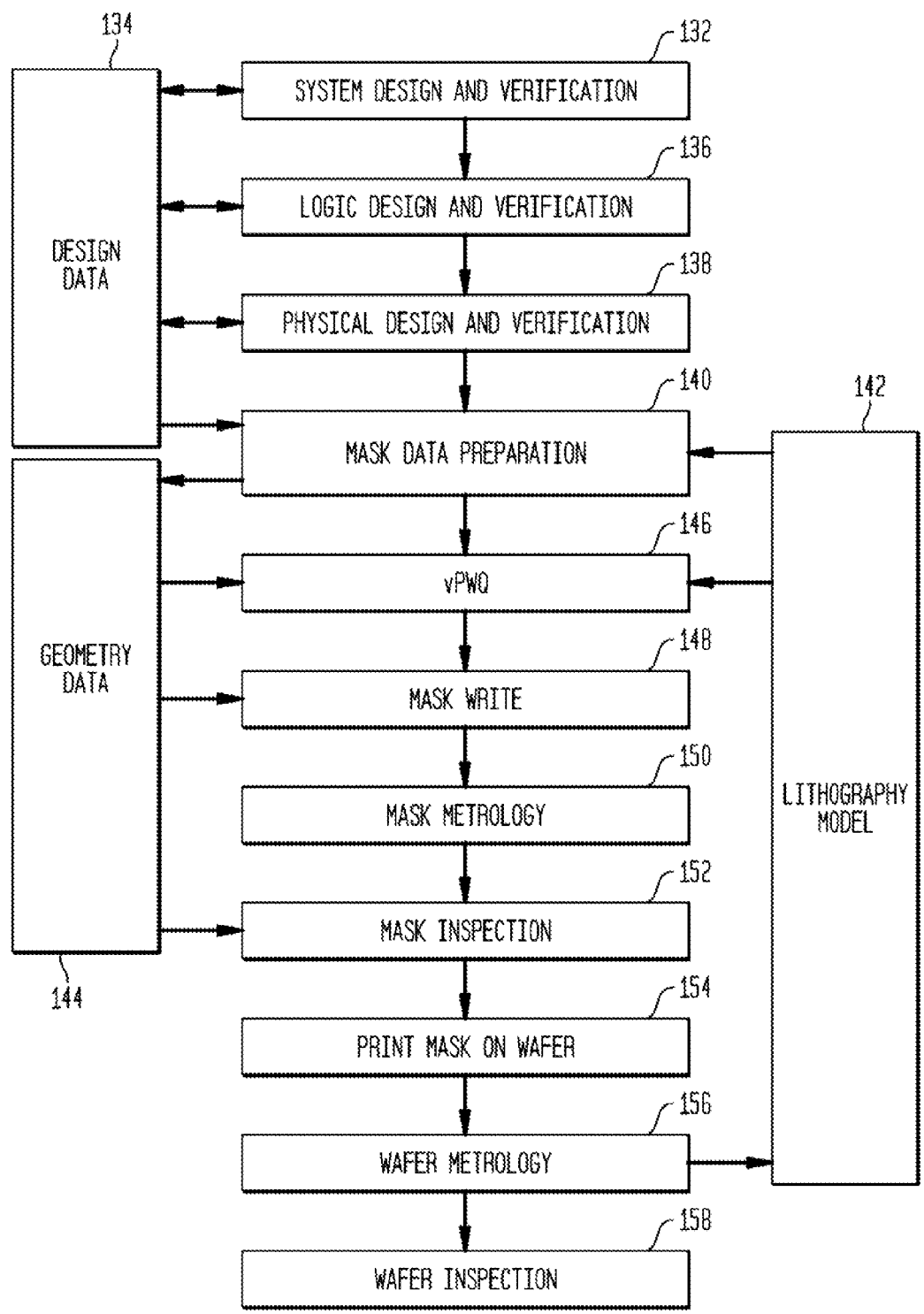
FIGS. 9-12 are flow charts illustrating various embodiments of a computer-implemented method for detecting defects in reticle design data.

FIG. 9 is a flow chart of another embodiment of a computer-implemented method for detecting defects in reticle design data. As shown in FIG. 9, this embodiment includes system design and verification, as shown in step 132. System design and verification can be performed using design data 134. In addition, the system design that is verified in step 132 may be provided to design data 134. System design and verification may be performance using any system and method known in the art. The method also includes logic design and verification, as shown in step 136. Logic design and verification 136 may be performed using design date 134 that was generated by system design and verification step 132. In addition, the logic design that is verified in step 136 may be provided to design data 134. Logic design and verification may be performed using any method and system known in the art.

The method includes physical design and verification, as shown in step 138. Physical design and verification may be performed in step 138 using design data 134 that was verified in step 136. Physical design and verification may be performed using any method and system known in the art such as DRC and LVS. In addition, the physical design that is verified in step 138 may he provided to design data 134. As shown in step 140, the method includes mask data preparation. Mask data preparation may be performed using design data 134 and lithography model 142. Mask data preparation may be performed using any method or system known in the art. The mask data may be provided to geometry data 144.

Instead of performing an optical rule check on the geometry data, the method includes vPWQ, as shown in step 146. vPWQ is performed using the mask data generated in step 140 (the results of which may be obtained from geometry data 144) and lithography model 142. vPWQ may also be performed according to any of the embodiments described herein. As described further herein, vPWQ may use the mask database as input and perform a full-die F-E matrix calculation. This calculation may be performed relatively quickly using the system described above. For instance, for 5 different focus values and 7 different exposure values, the calculation may be performed in about 10 hours for a 90 nm generation reticle design. The version of the vPWQ method that was used to perform this calculation detected a relatively large portion of CD defects (about 30% of all CD defects) and detected all catastrophic events such as shorts, opens, and printing SRAF. Obviously, these results were generated by only one version of the vPWQ method, and the defect detection results may be tailored and/or optimized as described above.

Output from the vPWQ method may be provided to the mask write, which is performed in step 148. The mask write process may also use geometry data 144 to perform all steps involved in printing the reticle design data on the reticle. The method includes performing mask metrology on the fabricated mask as shown in step 150. Mask metrology may be performed using any system and method known in the art. The method also includes inspection of the fabricated mask, as shown in step 152. Mask inspection may be performed using geometry data 144. Mask inspection may be performed using any method and system known in the art.

Depending on the results of the mask metrology and inspection (if the mask passes qualification specifications), the method includes printing the mask on a wafer, as shown in step 154. Printing the mask on the wafer may include using any system and method known in the art. The method also includes wafer metrology, as shown in step 156. Wafer metrology of the printed wafers may include any method or system known in the art. Results of wafer metrology may also be provided to lithography model 142. The results of the wafer metrology may be used to calibrate and/or update the lithography model. As shown in step 158, the method includes wafer inspection. Wafer inspection may be performed using any system and method known in the art. The method shown in FIG. 9 may also include any other step(s) described herein.

Figure 10:
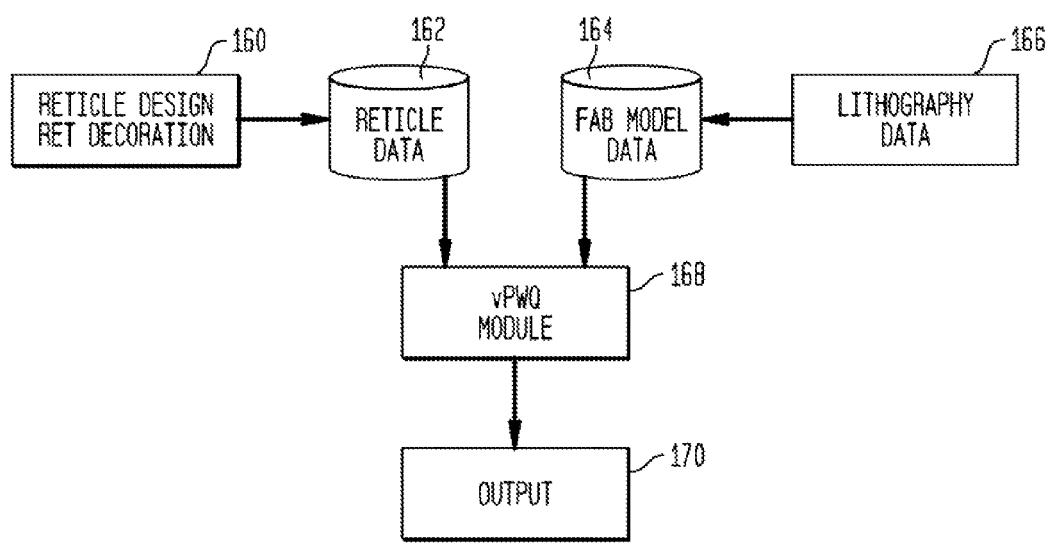

FIG. 10 is a flow chart of a different embodiment of a computer-implemented method for detecting defects in reticle design data. In particular, FIG. 10 illustrates one embodiment of a vPWQ method that may be used in any of the methods described herein. As shown in FIG. 10, reticle design and RET decoration data 160 may be used to generate reticle data 162. In this manner, reticle data 162 may include the decorated reticle design data. In addition, fab model data 164 may be generated using lithography data 166 such as scanner parameters, resist parameters, and predetermined process window (such as focus and dose range) that can be used to determine which different values of one or more parameters of the wafer printing process for which simulated images will be generated.

Reticle data 162 and fab model data 164 are provided to vPWQ module 168. vPWQ module 168 may include any hardware and/or software that can be used to generate the simulated images as described above using reticle data 162 and fab model data 164. In one embodiment, the vPWQ module may include a simulation engine such as that included in the PROLITH software. The simulation engine may be configured to generate the first and second simulated images as described herein. In another embodiment, the vPWQ module may be configured as a system that includes a simulation engine as described above coupled to a processor. The processor may be configured to detect defects in the reticle design data using the second simulated images according to any of the embodiments described herein. The vPWQ method performed by vPWQ module 168 may include any other step(s) described therein. The vPWQ module may be further configured as described herein.

As shown in FIG. 10, vPWQ module 168 generates output 170 that includes an error list. The error list may include all potential defects that were detected by the vPWQ module. One or more additional functions may be performed on output 170 by either the vPWQ module or another software module or other hardware. For example, potential defects in the error list may be examined to determine if the potential defects are actual defects, what kind of defects the potential defects are. etc. In addition, the output may be used to determine the process window that can be used with the reticle design data. Determining the process window for a wafer so printing process to be used with the reticle may be performed as described above. In addition, the output may be formatted for presentation to a user, use by another software module, storage in one or more modules such as a fab database, etc. The method shown in FIG. 10 may include any other step(s) described herein.

Figure 11:
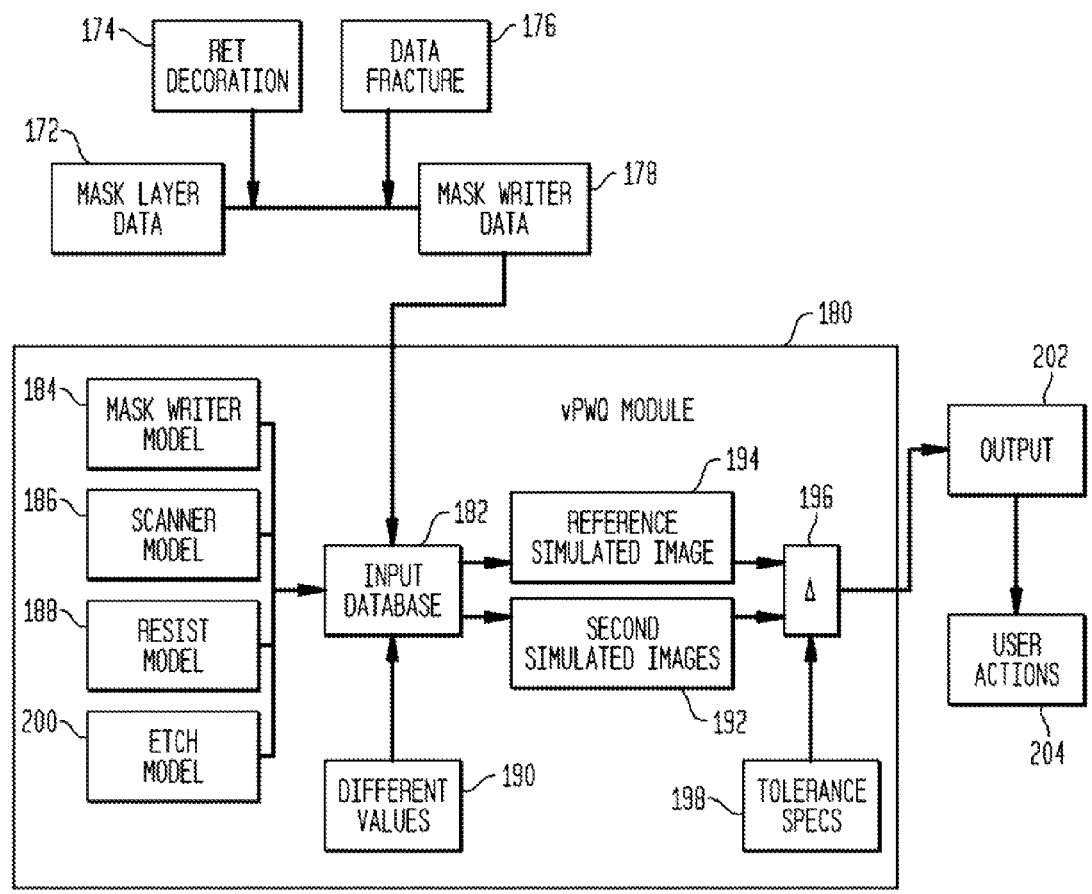

FIG. 1 is a flow chart of an additional embodiment of a computer-implemented method for detecting defects in reticle design data. As shown in FIG. 11, mask layer data 172 is modified by RET decoration 174 and data fracture 178. The modified mask layer data is used to generate mask writer data 178. Mask writer data 178 is provided to vPWQ module 180. For example, mask writer data 178 may be provided to input database 182 of vPWQ module 180. The vPWQ module may also include a model describing the reticle manufacturing process. This model may include mask writer model 184. The vPWQ module may use mask writer model 184 with mask writer data 178 in input database 182 to generate a first simulated image illustrating how the mask writer data will be printed on a reticle using the reticle manufacturing process.

The vPWQ module may also include one or more models describing the wafer printing process. These models may include scanner model 186 and resist model 188. In addition, different values 190 of one or more parameters of a wafer printing process may be provided to input database 182. These one or more parameters may include, for example, focus F and exposure E. In addition, the different values of the one or more parameters provided to input database 182 may include nominal values (e.g., $F_0$, $E_0$) for the parameter(s). The different values of the one or more parameters provided to input database 182 may also include test values (e.g., $F_n$, $E_n$). These test values may include values that are within a predetermined process window for the reticle. In some embodiments, these test values may span the predetermined process window.

The vPWQ module uses scanner model 186, resist model 188, the first simulated image, and different values 190 to generate second simulated images 192. The second simulated images illustrate how the mask writer data printed on the reticle will print on a wafer at the different values of the one or more parameters of the wafer printing process. The second simulated images may also illustrate how the entire chip will be printed on the wafer at the different values of the one or more parameters of the wafer printing process. In this embodiment, vPWQ module 180 may also generate reference simulated image 194 using scanner model 186, resist model 188, the first simulated image, and the nominal vales for the parameters(s) of the wafer printing process. Reference simulated image 194 is compared to second simulated images 192 to determine differences 196 between the simulated images. The vPWQ module may use tolerance specifications 198 to determine what qualifies as a difference. The differences between the compared simulated images may be used to detect defects in the reticle design data as described further herein.

In some embodiments, instead of, or in addition to, detecting defects in the reticle design data using simulated images that illustrate how the reticle design data will be printed on a wafer by a wafer printing process, defect detection may be performed using simulated images that illustrate the pattern in the wafer after a different semiconductor manufacturing process. For example, in one embodiment, vPWQ module 180 may include etch model 200. Etch model 200 describes an etch process that will be performed on the wafer after the reticle design data is printed on the wafer by the lithography process. vPWQ module 180 may use etch model 200 in combination with the second simulated images to generate additional simulated images that illustrate how the reticle design data will be printed on the wafer by the etch process. These additional simulated images may be compared to a reference simulated image to detect differences between the simulated images as described above. The differences between the simulated images may be used to detect defects in the reticle design data. Similar image simulation and defect detection may also or alternatively be performed by the vPWQ module for any other processes that will be performed on the wafer and that may affect the pattern printed on the wafer. Such processes may include, for example, deposition and chemical-mechanical polishing.

vPWQ module 180 generates output 202 based on differences 196 between simulated images 192 and reference simulated image 194. Output 202 may include coordinates of the differences between the simulated images, portions of the simulated images (test and/or reference) corresponding to the positions of the differences, a database clip, a process window determined for the reticle design data, and/or the severity (e.g., the magnitude) of the differences detected between the different simulated images. vPWQ module 180 may also be configured to allow one or more user actions 204 to be performed based on output 202. The user actions may include, for example, rejection of the reticle design data, selection of additional simulation to be performed by, the vPWQ module, adjustment of one or more parameters of the vPWQ module, and/or alteration of the rules used by the vPWQ module. The method illustrated in FIG. 11 may include any other step(s) described herein.

Figure 12:
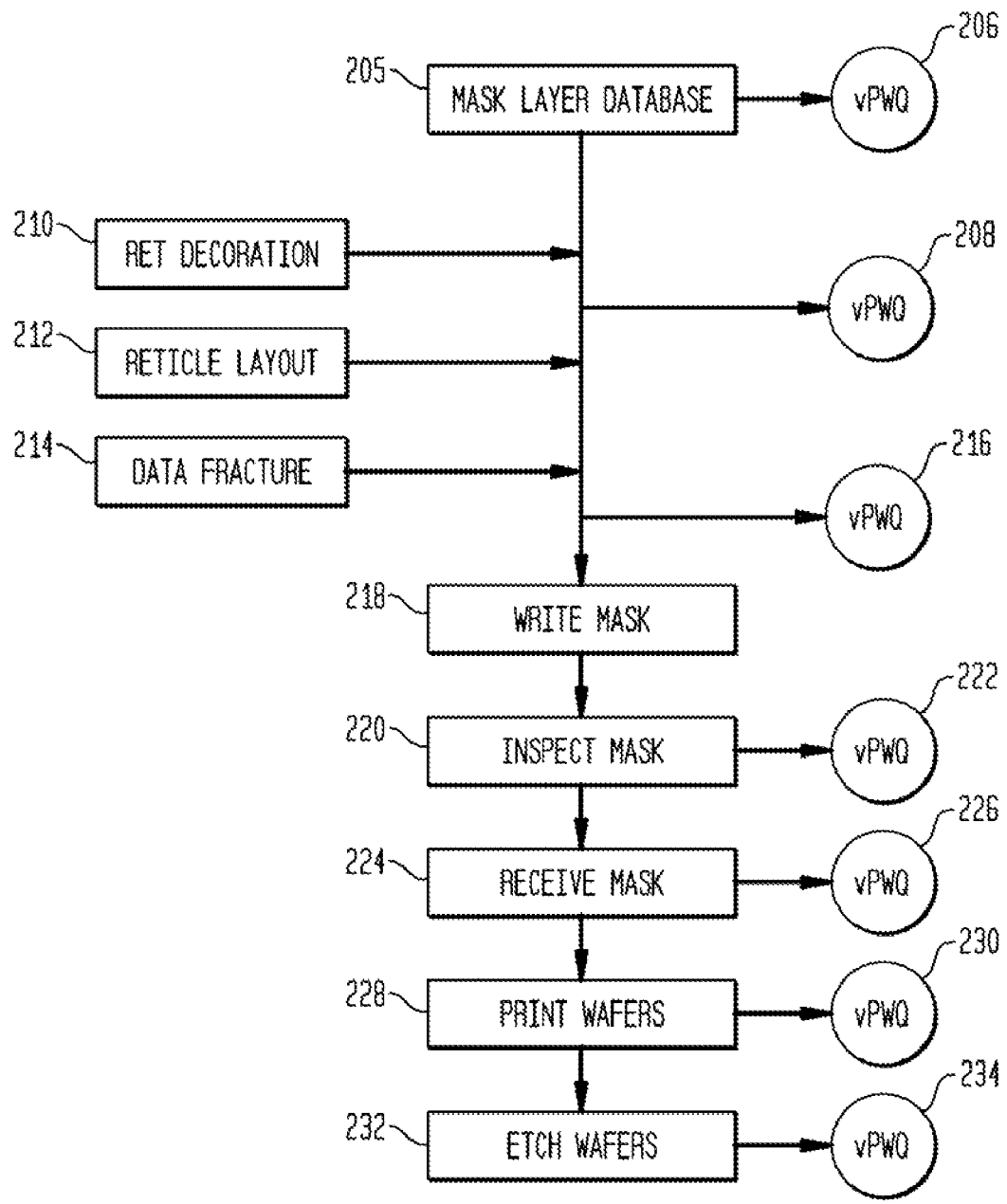

FIG. 12 is a flow chart illustrating yet another embodiment of a computer-implemented method for detecting defects in reticle design data. In particular, FIG. 12 illustrates different points in a semiconductor manufacturing process at which some form of vPWQ can be performed. For example, as shown in FIG. 12, this method may include performing vPWQ 206 on mask layer database 205. After the mask layer database is modified by RET decoration 210, vPWQ 208 may be performed on the decorated mask layer data. After vPWQ 208, the decorated mask layer data may be used to generate reticle layout 212. Reticle layout 212 is used to perform data fracture 214. After data fracture 214, vPWQ 216 may be performed on the fractured data. vPWQ 206, 208, and 216 may be performed as described herein.

After vPWQ 216 is performed, the mask may be manufactured as shown in step 218. After the mask is manufactured, the method may include inspecting, the fabricated mask, as shown in step 220. Inspecting the fabricated mask may include vPWQ 222 using an image of the fabricated mask. In other words, vPWQ 222 may be performed as described herein with the exception that instead of using first simulated images to generate the test simulated images, in vPWQ 222, an image of the actual mask may be used to generate the test simulated images. After inspection of the mask, assuming that the mask passes qualification, the mask is received by the production facility, as shown in step 224. Wherein the mask is received by the production facility, vPWQ 226 may again be performed using an image of the fabricated mask as described above.

The method also includes printing wafers using the fabricated mask, as shown in step 228. After the wafers are printed, vPWQ 230 maybe performed using images of the actual printed wafers. In other words, vPWQ 230 may be performed as described herein with the exception that the second simulated images may be replaced with images of the printed wafers. After vPWQ 230 has been performed, the method may include etching the printed wafers, as shown in step 232. After the printed wafers have been etched, vPWQ 234 may be performed using images of the actual etched wafers. In other words, vPWQ 234 may be performed as described herein with the exception that the second simulated images may be replaced with images of the etched wafers. In addition, vPWQ may also be performed after other steps of the semiconductor manufacturing process. In this manner, the vPWQ methods described herein have application at many different points throughout a semiconductor manufacturing process, as shown in FIG. 12. The method shown in FIG. 12 may include any other step(s) described herein.

A system configured to perform one or more of the computer-implemented methods described herein includes a computer system. The computer system may be configured as described above. The system also includes a carrier medium. The carrier medium may be coupled to, or included in, the computer system using any method or device known in the art. Program instructions implementing methods such as those described herein may be transmitted over or stored on the carrier medium. The carrier medium may be a transmission medium such as a wire, cable, or wireless transmission link. The carrier medium may also be a storage medium such as a read-only memory, a random access memory, a magnetic or optical disk, or a magnetic tape.

In an embodiment, the computer system may be configured to execute the program instructions to perform a computer-implemented method according to any of the above embodiments. In general, the term "computer system" may be broadly defined as any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired. The system may be further configured as described herein.

The embodiments described further herein can be used to accurately determine the lithography process windows of a given process for an individual design using a computer-related simulation system and analysis. The embodiments described further herein can also be used to enhance the process window through design-based process re-centering. Although some embodiments are described herein with respect to a lithography process, it is to be understood that the embodiments may be used to determine different process windows for any wafer printing process such as an etch process or any other wafer fabrication process known in the art for different reticle designs.

One embodiment relates to a computer-implemented method for determining different process windows for a wafer printing process (e.g., a lithography process) for different reticle designs. In other words, the process windows are determined on a design-to-design basis, and each of the process windows determined by this method may be referred to as a "design-based process window." Each of the different reticle designs may be stored as reticle design data. The reticle design data for each of the different reticle designs may be stored in a different design database. In addition, one or more of the different reticle designs may include RET features. In other words, the method may be performed for reticle designs after OPC decoration of the reticle designs has been performed. The different reticle designs may be further configured as described herein.

The method includes generating simulated images illustrating how each of the different reticle designs will be printed on a wafer at different values of one or more parameters of the wafer printing process. Generating the simulated images may be performed as described herein. For example, in one embodiment, generating the simulated images includes generating first simulated images illustrating how each of the different reticle designs will be printed on a reticle using a reticle manufacturing process and generating the simulated images using the first simulated images. These steps may be performed as described herein. The simulated images generated in this method may include any of the simulated images described herein. For example, in one embodiment, the simulated images include stimulated images of a complete chip defined by each of the different reticle designs.

In some embodiments, the different values of the one or more parameters of the wafer printing process span a predetermined process window for the one or more parameters of the wafer printing process. The predetermined process window and the different values may be determined or selected as described further herein. In addition, the predetermined process windows and the different values may be selected by a user of the embodiments described herein or by the embodiments themselves (e.g., automatically).

The method also includes detecting defects in each of the different reticle designs using the stimulated images. Detecting the defects in this method may be performed as described further herein. For example, in one embodiment, detecting the defects includes determining which of the different values at which at least one of the defects appears in the simulated images. This step may be performed as described herein. In another embodiment, detecting the defects includes determining, one or more patterns in each of the different reticle designs in which the defects appear at the different values that are closer to nominal values for the one or more parameters than the different values at which the defects appear in other patterns in each of the different reticle designs. This step may be performed as described herein. Therefore, detecting the defects may include determining the one or more patterns in the different reticle designs that are weakest or most limiting to the process window and therefore yield of the fabrication process. The one or more patterns in at least some of the different reticle designs that are determined to be the weakest may not be the same pattern(s).

The defects that are detected in the method may include any of the defects described herein including defects such as catastrophic failures, CD variations, gap or open defects, bridge defects, line-end shortening (LES) defects, interlayer overlap (ILO) defects, which may be caused by LES defects, and enclosure defects. The defect detection method and/or algorithm that is used in the method may vary depending on, for example, the defect types of interest. For example, if ILO defects are of interest, detecting the defects may include comparing the simulated images to design data for a layer, other than the layer that will be printed using the reticle design being inspected, that will also be printed on the wafer. In one such example, comparing the simulated images to the design data may include overlaying the design data with the simulated images to determine if characteristics of features of the simulated images such as LES will cause ILO defects such as lack of overlap between a line on one layer and a contact on another layer.

Furthermore, as a reticle design begins to fail at certain of the different values, a substantial number of defects may be detected in the simulated images generated at those different values. In addition, the defects detected in the simulated images generated at those different values may include a number of different types of defects. Therefore, in some embodiments, detecting the defects may include binning the defects into one or more groups, each of which contains "non-unique" defects or defects that are similar to each other (e.g., lithographically speaking) or defects that are located in similar contexts (e.g., design patterns), such that the various types of defects can be more accurately examined (e.g., by virtual defect review) to determine more accurately the impact that different types of defects have on the process window or to determine the number of defects having a particular impact on the process window. In this manner, the process window may also be more accurately determined based on only defect types that are known to affect yield. Examples of methods and systems that can be used to separate defects into different groups based on similarities of the defects are illustrated in commonly-assigned U.S. patent application Ser. No. 11/005,658 filed Dec. 7, 2004 by Wu et al., published as U.S. Patent Application Publication. No. 2006/0291714, published on Dec. 28, 2006, which is incorporated by reference as if fully set forth herein. Examples of methods and systems that can be used to separate defects into different groups based on context are illustrated in commonly-assigned U.S. patent application Ser. No. 11/561,659, by Afar et al., filed Nov. 20, 2006, and Ser. No. 11/561,735, by Konkani et al., filed Nov. 20, 2006, both of which are incorporated by reference as if fully set forth herein. The embodiments described herein may include any of the step(s) of any of the method(s) described in this patent application.

Results of such grouping may include, for example, a pareto chart illustrating the number of defects detected versus process window impact of different defects. Sorting defects based on process window impact can be useful for process window monitoring. For example, by determining where a defects appears in FE space and the values of the one or more parameters at which the defect is detected relative to the nominal values for the one or more parameters of the wafer printing process, the embodiments described herein can easily obtain the process window impact separation and sort defects based on the process window impact. Such sorting provides a powerful guide for prioritizing structures in the reticle design for correction. For instance, those defects in the reticle design that have the biggest process window impact may be corrected first since they set the process window limits. Without such information, those defects that are not the process window limiters may be corrected, and as a result no process window improvements will be obtained.

Generating the simulated images and detecting the defects as described above may be generally referred to as a "DesignScan inline inspection." In this manner, the embodiments described herein may be used for inline process window monitoring. For each reticle design, the DesignScan inline inspection may be performed with predetermined different values for the one or more parameters of the wafer printing process. For example, the predetermined different values may include 9 sets of values for focus and exposure, which may include the center of nominal values for focus and exposure and values of focus and exposure located at or near the edge of the predetermined process window (or "entitlement process window," which may be the process window currently used for the wafer printing process). 9 sets of values for focus and exposure may be used at a minimum in the methods described herein to adequately monitor the performance of the different reticle designs across the process window by varying focus, dose, and both (diagonally) around the nominal values.

The method further includes determining a process window for the wafer printing process for each of the different reticle designs based on results of the detecting step. The process window for each of the different reticle designs may be determined based on any of the results of the detecting step described herein. For example, the process window may be determined based on the different values at which at least one of the defects appears in the simulated images. In particular, the process window may be determined such that the process window excludes the different values at which at least one of the defects appears in the simulated images.

The process window may also be determined based on the different values at which at least one of the defects appears in the simulated images in combination with one or more characteristics of the defects and/or one or more characteristics of the portion of the reticle design in which the defects are located. For example, if a non-yield limiting defect is detected in a device portion of a reticle design, the process window may not be limited to exclude the value(s) of the one or more parameters of the wafer printing process at which the defect appears depending on other results of the detecting step (e.g. whether killer or yield limiting defects are detected in other device portion(s) of the reticle design at the same value(s) of the one or more parameters). However, if a killer or yield-limiting defect is detected in a device portion of a reticle design the process window may be determined such that the process window excludes the value(s) of the one or more parameters of the wafer printing process at which the defect appears. In another example, if a defect is detected in a test portion of a reticle design, the process window may not be limited to exclude the value(s) of the one or more parameters of the wafer printing process at which the defect appears depending on other results of the detecting step (e.g., whether defects are detected in device portion(s) of the reticle design at the same value(s) of the one or more parameters). Since the process window can be determined in the embodiments described herein on a design-to-design and inline basis, the methods may be used to monitor the process window for various reticle designs, and the results of such methods may be used in a variety of ways such as feedback to the design process to improve future reticle designs and creation of new manufacturing processes, which may be performed as described herein.

Figure 13:
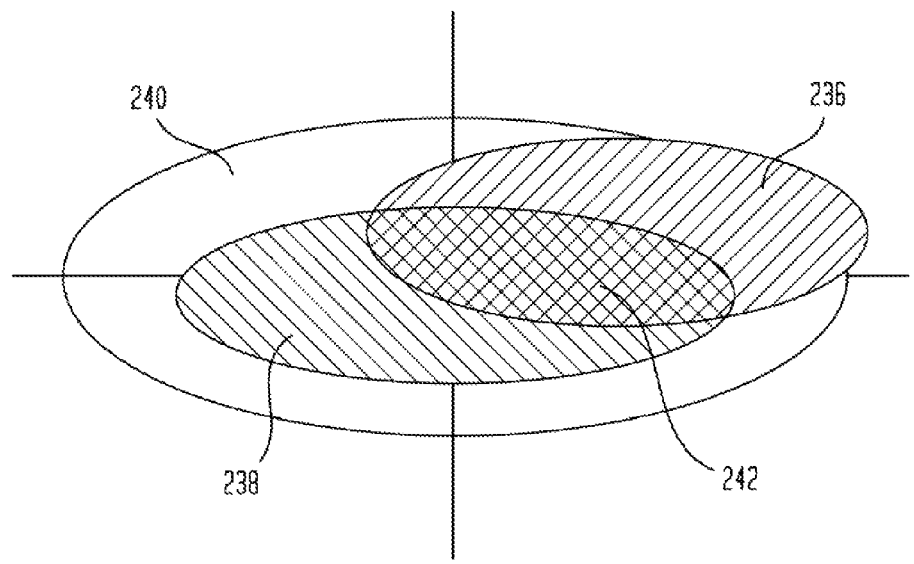
FIGS. 13-14 are schematic diagrams illustrating various examples of results that may be produced by method embodiments described herein.

The process window, may also be determined from individual process windows for different types of features in the reticle design. For example, the failure probability of the weakest pattern(s), which may be identified as described herein, generally determines the overall product process window and yield. However, different patterns may have different process windows. For example, as shown in FIG. 13, process window 236 may be determined for one type of device feature (not shown) in a reticle design (not shown). However, process window 238 may be determined for a different type of device feature (not shown) in the reticle design. As shown in FIG. 13, process windows 236 and 238 are different from each other. In addition, process windows 236 and 238 are different than predetermined process window 240 or the "entitlement process window."

Determining the process window for each of the different reticle designs in the embodiments described herein may, therefore, include comparing the process windows for different features in each of the different reticle designs to determine the most appropriate process window for each reticle design. For example, as shown in FIG. 3, process windows 236 and 238 at least partially overlap in process window space 242. As such, in this example, process window space 242 may be determined to be the process window for the reticle design. Although the example shown in FIG. 13 illustrates the process windows for only two different types of features, it is to be understood that a process window may be independently determined for each different type of feature in a reticle design, and the overall process window for the reticle design may be determined from the individual, process windows for each different type of feature in the reticle design.

In some embodiments, the method includes altering at least one of the different reticle designs based on the results of the detecting step. Altering at least one of the different reticle designs based on the results of the detecting step may include altering RET features of the at least one reticle design. For example, if defects are detected in the detecting step described above, the reticle design for which the defects are detected may be modified and the DesignScan inline inspection may be performed for the modified reticle design, until no defects are detected in the DesignScan inline inspection. In one such embodiment, modifying the reticle design may include modifying the RET features of the reticle design until no defects are detected in the DesignScan inline inspection. Such modifying of the reticle design(s) may be performed prior to determining the process window for each of the reticle designs and/or prior to other step(s) described herein. In this manner, the embodiments described herein can be used to "fit" a reticle design to a process. In other words, the embodiments may include rendering a reticle design acceptable for a predetermined process.

The method may include determining the manufacturability, inspectability, and/or printability of one or more or each of the different reticle designs and/or altering one or more of the different reticle designs based on the manufacturability, inspectability, and/or printability. Examples of methods, systems, and carrier media that can be used to determine the manufacturability, inspectability, and/or printability of a reticle design are illustrated in commonly-assigned U.S. patent application Ser. No. 11/226,698 filed on Sep. 14, 2005 by Verma et al., published as U.S. Patent Application Publication No. 2006/0062445, published on Mar. 23, 2006, which is incorporated by reference as if fully set forth herein. The method embodiments described herein may include any step(s) of any of the method(s) described in this patent application. Preferably, the reticle design is altered to increase the process window for the e reticle design. In particular, since the method detects defects in simulated images illustrating how the reticle design will be printed on a wafer, the method may include altering the reticle design based on the defects that will be printed on the wafer and verifying the reticle design based on the defects that will be printed on the wafer. In this manner, the methods described herein may include or be used for "lithography aware" reticle design verification.

In some embodiments, the method includes determining a center of the process window for each of the different reticle designs based on the results of the detecting step. For example, the center of the process window may be altered in focus and/or dose. In addition, since the center of the process window is determined for each different reticle design independently of the process windows for other reticle designs, the center of the process window is different for at least some of the different reticle designs. In some embodiments, the center of the process window is determined such that a distance between the center and process window boundaries for each of the different reticle designs is maximized. In this manner, re-centering the process window may avoid asymmetry in the control of one or more characteristics of the reticle design printed on wafers such as CD thereby effectively extending the process window. Therefore, re-centering the process window reduces defect-related yield loss assuming that no other negative effects in device functionality are caused by the process window re-centering.

In contract, typically a process window center is determined using test structures, and this center is used for all reticle designs. Such a static process window center is inadequate because the test structures do not always represent the full reticle design and because the behavior of all designs is not identical through a process window. Using the embodiments described herein, however, the process window center can be determined and optimized for each individual design thereby providing the largest possible process window and hence yield for each individual design.

Figure 14:
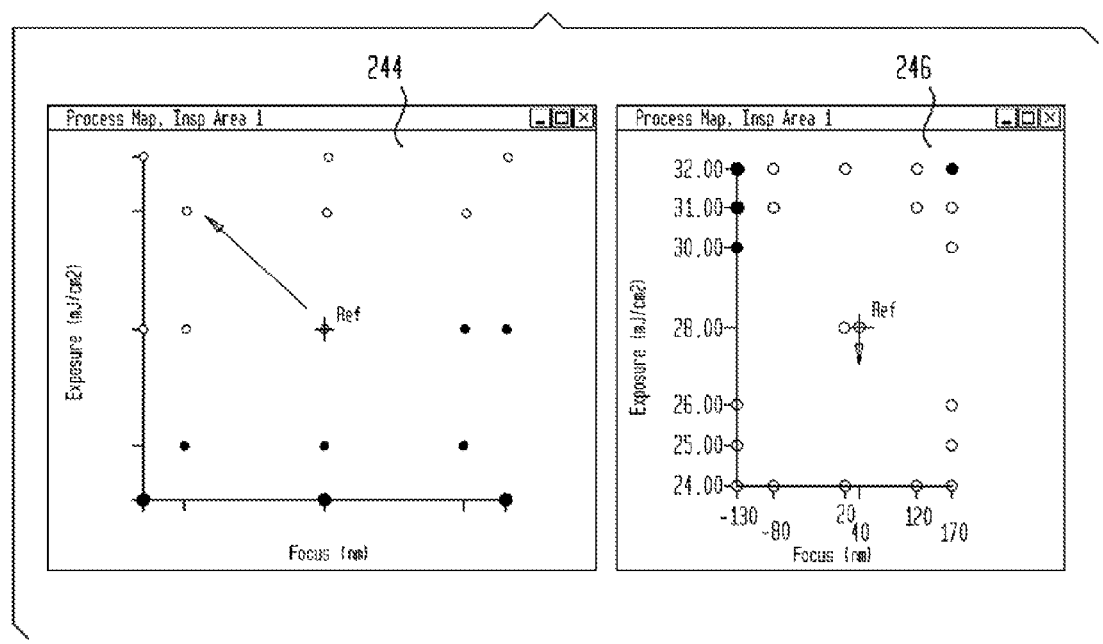

In one such example, FIG. 14 illustrates results 244 and 246 that were produced by the detecting step described above for different reticle designs. Results 244 and 246 indicate if defects were detected at each set of values for focus and exposure of the wafer printing process for which the simulated images were generated. In particular, for each set of values for focus and exposure at which simulated images were generated and used for the detecting step, an open circle indicates that no defects were detected in the simulated images and a closed circle indicates that defects were detected in the simulated images. Different sizes of closed circles can be used to indicate different types of defects that were detected in the simulated images or the number of defects that were detected in the simulated images. In addition, different colors of the closed circles can be used to indicate different types of defects that were detected in the simulated images or the number of defects that were detected in the simulated images. The circles labeled as "Ref" in the results indicates the reference or nominal values of the one or more parameters, which may be equal to the values of focus and exposure at the center of the predetermined process window.

As shown in results 244, defects were detected in the simulate images generated at sets of values that include all values of focus at relatively low values of exposure and the simulated images generated at sets of values that include nominal values of exposure and high values of focus. Therefore, the center of the process window may be moved in the direction of the arrow shown in results 244 away from the "Ref" values and away from the sets of values of focus and exposure at which the defects were detected. In contrast, as shown in results 246, defects were detected in the simulated images generated at sets of values for focus and exposure including −130 nm focus and 31.00 mJ/cm$^2$ exposure, −130 nm focus and 32.00 mJ/cm$^2$ exposure, and 170 nm focus and 32.00 mJ/cm$^2$ exposure. Therefore, the center of the process window may be moved in the direction of the arrow shown in results 246 away from the "Ref" values and away from the sets of values of focus and exposure at which the defects were detected.

The sets of values corresponding to the simulated images in which the defects were detected may define the boundaries of the process window. In other words, the sets of values corresponding to the simulated images in which the defects were detected define the limits of the process window in one or more dimensions. Since the defects were detected in results 244 and 246 at sets of values that define only some of the process boundaries (only some of the boundaries for low values of exposure, high values of exposure, low values of focus, and high values of focus), the method may include moving the center of the process window as described above by some predetermined value or based on the results of the detecting step, and the DesignScan inline inspection may be repeated using the new center of the process window until all boundaries of the process window have been determined. For example, in one embodiment, the method includes determining a center of the process window for each of the different reticle designs based on the results of the detecting step and performing the method (e.g., including at least the steps of generating the simulated images, detecting the defects, and determining the process window described herein), for each of the different reticle designs for which the center is different than predetermined nominal values for the one or more parameters, using other different values of the one or more parameters defined based on the center. When all boundaries of the process window have been determined, the center of the process window may be determined such that a distance between the center and each of the process window boundaries for each of the different reticle designs is maximized.

In one embodiment, if defects are detected for at least one of the different reticle designs, the method includes determining a center of the process window for the at least one reticle design based on the results of the detecting step, and performing the method (e.g., performing at least the steps of generating the simulated images, detecting the defects, and determining the process window) for the at least one reticle design until the defects are not detected for the at least one reticle design. For example, if defects are detected in the detecting step described above, the process window for the reticle design for which the defects are detected may be re-centered (from the center of the predetermined process window) and the DesignScan inline inspection may be performed as described above for different values of the one or more parameters of the wafer printing process that span a process window that is selected based upon the new center of the process window, until no defects are detected in the DesignScan inline inspection. Such iterative process re-centering and process window determination may be performed prior to other step(s) described herein. In this manner, the embodiments described herein allow a process to be "fit" to a design. In other words, the embodiments may include rendering a wafer printing process acceptable for a predetermined reticle design. In addition, in some embodiments, if defects are detected for a reticle design, the method may include altering the reticle design, which may be performed as described above, and re-centering the process window for the reticle design, until no defects are detected for the reticle design by the DesignScan inline inspection.

In another embodiment, the method (e.g., at least the steps of generating the simulated images, detecting the defects, and determining the process window) may be performed using other different values of the one or more parameters that exceed a predetermined process window for the one or more parameters of the wafer printing process. In one such embodiment, detecting the defects using the simulated images generated at the other different values includes determining one or more patterns in each of the different reticle designs in which the defects appear at the other different values that are closer to nominal values for the one or more parameters than the other different values at which the defects appear in other patterns in each of the different reticle designs. In this manner, the method may include performing a DesignScan process window inspection by pushing focus and exposure conditions beyond the entitlement process window (i.e., away from the nominal conditions). As such, the method may include determining the weakest patterns in each of the different reticle designs such as gap defects and bridge defects that tend to appear at higher and lower doses, respectively.

The other different values may exceed the predetermined process window to any suitable degree. For example, the other different values may span a process space that is about twice as large as the predetermined process window. The degree to which the other different values exceed the predetermined process window may be selected by a user or selected by the embodiments described herein (e.g., automatically). In addition, depending on the degree to which the other different values exceed the predetermined process window, the method may include altering one or more of the different reticle designs to extend the process window further (e.g., for process window optimization). Such altering of the one or more different reticle designs may be performed according to any of the embodiments described herein. In addition, the detecting step may include determining the weakest pattern(s) or most process window limiting patterns(s) (i.e., hot spots or weak spots) in each of the reticle designs using the original set of different values (which may span a predetermined process window) as described above and/or using different values that exceed the predetermined process window.

In some embodiments, the method includes generating a reticle manufacturing process for at least one of the different reticle designs based on the results of the detecting step. Any, some combination, or all of the defect information described herein can be used in subsequent reticle manufacturing processes (for pattern dependent CD control). For example, generating the reticle manufacturing process may include determining pattern dependent CD control to be used during reticle manufacturing on a design-to-design basis. Determining the pattern dependent reticle CD specifications may be performed by the method based on weak pattern(s) identified according to any of the embodiments described herein. In this manner, the weakest pattern information for a specific design can be used to determine the reticle manufacturing process.

In particular, the weakest pattern(s) in each of the different reticle designs may be identified as the "process control pattern(s)," or the patterns to be used for process control, and may be used to determine the reticle manufacturing process. In one particular example, since it is known that gap defects are the weakest and therefore the process window limiters, it is critical to achieve tight CD control in the reticle manufacturing process in the regions of the reticle that contain those gap defects. The CD control in other regions is less critical; thus, the CD control specifications can be relaxed in the other regions. Generating the reticle manufacturing process may also or alternatively be performed as described further herein.

The embodiments described herein may also include generating design-based reticle specifications. In other words, the method may include determining reticle specifications such as the bias on a design-to-design basis. For example, the reticle target CD specification can be determined through process window simulation across a range of target CDs by biasing the reticle design (e.g., the polygons of the post-OPC reticle design data) by a few nanometers in both the positive and negative directions during data conversion and re-inspecting the reticle design. By evaluating the process window impact of the biased reticle design, the CD tolerance specifications for different regions of the reticle design can be determined. In addition, design-based reticle specifications may be determined for the complete chip defined by each of the different reticle designs.

In another example, the method may be performed for different values of one or more parameters of the wafer printing process as described above. The method may also be performed for different values of the reticle manufacturing process. Therefore, defects may be detected in each of the different reticle designs using simulated images that illustrate how each of the different reticle designs when manufactured on a wafer with different reticle specifications will be printed on a wafer. The defects may be used to determine a process window for each of the reticle designs and reticle specification combinations. The process window may be determined for each of the combinations for the wafer printing process as well as the reticle manufacturing process. In addition, other steps described herein such as determining a center of the process window may be performed for each combination of the reticle design and the reticle specifications. The center of the process window may be determined for a process window of the wafer printing process as well as for a process window of the reticle manufacturing process for each of the combinations of reticle design and reticle specifications. In this manner, the reticle specifications that result in the best process window for a reticle design may be selected for the reticle manufacturing process.

In an embodiment, the selected reticle specifications may be stored, for instance, in a volatile and/or in a non-volatile storage medium. The stored reticle specifications may be accessed, displayed, read, written, re-stored, and/or used by any suitable entity, including for instance one or more users, one or more software applications and/or modules, one or more systems, and the like. For example, the stored reticle specifications may be utilized to generate a write file, and the generated write file may be transmitted and/or sent to a reticle manufacturing device, a reticle manufacturing system, a reticle manufacturing tool, and the like. The reticle manufacturing device, system, and/or tool may read or otherwise access the write file to write one or more reticles. In an alternative embodiment, for instance, the reticle specifications ay, be used to create one or more reticle inspection recipies, and the one or more reticle inspection recipies may be transmitted to one or more reticle inspection tools that may use the one or more reticle inspection recipies to inspect a manufactured reticle and/or other manufactured item.

In another embodiment, the method includes generating an inspection process for at least one of the different reticle designs based on the results of the detecting step. The inspection process may be used for inspection of a reticle on which a reticle design has been printed. In other words, the inspection process may be used for fabricated reticles. Generating the inspection process may be performed as described herein. For example, the weakest pattern information for a specific design can be used to determine the inspector process. In particular, the weakest pattern(s) in each of the different reticle designs may be identified as the "process control pattern(s)," or the patterns to be used for process controls, and may be used to determine an inspection process for at least one of the different reticle designs. In this manner, the processes may be configured to particularly monitor the weakest pattern(s) or hot spots in the reticle design thereby facilitating detection of systematic yield detracting-type defects on a fabricated reticle.

In an additional embodiment, the method includes generating a monitoring process for the wafer printing process for at least one of the different reticle designs based on the results of the detecting step. Generating the monitoring process may include one or more parameters (e.g., sampling) for any monitoring process known in the art (e.g., any metrology process known in the art, any inspection process known in the art, any defect review process known in the art, any defect analysis process known in the art, etc.). For example, any, some combination, or all of the defect information described herein can be used in wafer processing monitoring (for pattern dependent yield loss monitoring). In one such example, the weakest pattern information for a specific design can be used to determine the monitoring process for wafers printed with that design. In particular, the weakest pattern(s) in each of the different reticle designs may be identified as the "process control pattern(s)," or the patterns to be used for process control, and may be used to determine the monitoring process. In this manner, the monitoring process may be configured to particularly monitor the weakest pattern(s) or hot spots in the reticle design thereby facilitating detection of systematic yield detracting-type defects. In one particular example, in wafer processing (e.g., lithography and/or etch), the gap defect locations (structures) will be the first to fail if the process deviates from the nominal conditions, which can cause yield loss. Such information will greatly increase wafer processing monitoring efficiency. Generating the monitoring process may also or alternatively be performed as described further herein.

In addition, or alternatively, the weakest pattern information for a specific design call be passed on to a reticle manufacturing process, an inspection process, a monitoring process, or some combination thereof such that the weakest pattern information can be used during one or more of these processes. For example, the hot spot information may be passed downstream to monitor the hot spots in reticle manufacturing and wafer printing since these patterns are the most sensitive and the first to fail in the design due to process window drift or change. In this manner, the embodiments described herein can be used for "design aware" manufacturing and/or process control.

In an additional embodiment, subsequent to determining the process window, the method includes generating additional simulated images illustrating how each of the different reticle designs will be printed on the wafer at other different values of the one or more parameters. Differences between the other different values are finer than differences between the different values. Such a method may also include performing the detecting step using the additional simulated images and determining the process window based on results of the detecting step performed using the additional simulated images. In this manner, the process window may be determined first using relatively coarse values of the one or more parameters and then using relatively fine values of the one or more parameters such that the process window can be determined more accurately using the finer values. Determining the process window using a coarse grid of focus and exposure values and a fine grid of focus and exposure values may both be performed for a complete chip defined by each of the different reticle designs (i.e., the entire reticle design data or the entire reticle design database). For example, to accurately predict the wafer printing process window, the method may include performing an additional DesignScan inspection with a fine focus exposure grid to accurately locate the process window boundaries and to check for process re-centering. In addition, after the fine focus exposure grid DesignScan inspection of a specific design, the process window and the process center for that design can be automatically determined using DesignScan and reported to a user automatically.

In a further embodiment, the method includes generating additional simulated images illustrating how each of the different reticle designs will be printed on the wafer at different values of one or more other parameters of the wafer printing process, performing the detecting step using the additional simulated images, and optimizing the wafer printing process for each of the different reticle designs by selecting values for the one or more other parameters for each of the different reticle designs based on the results of the detecting step performed using the additional simulated images. In this manner, process optimization may be performed by varying one or more other parameters of the wafer printing process such as exposure tool settings (e.g., illumination source shape, NA, etc.), lithography track settings, resist parameters, any other parameter other than focus and exposure, or some combination thereof to maximize the lithography process window for a specific design database. In this manner, the method may include design-based process optimization.

Figure 15:
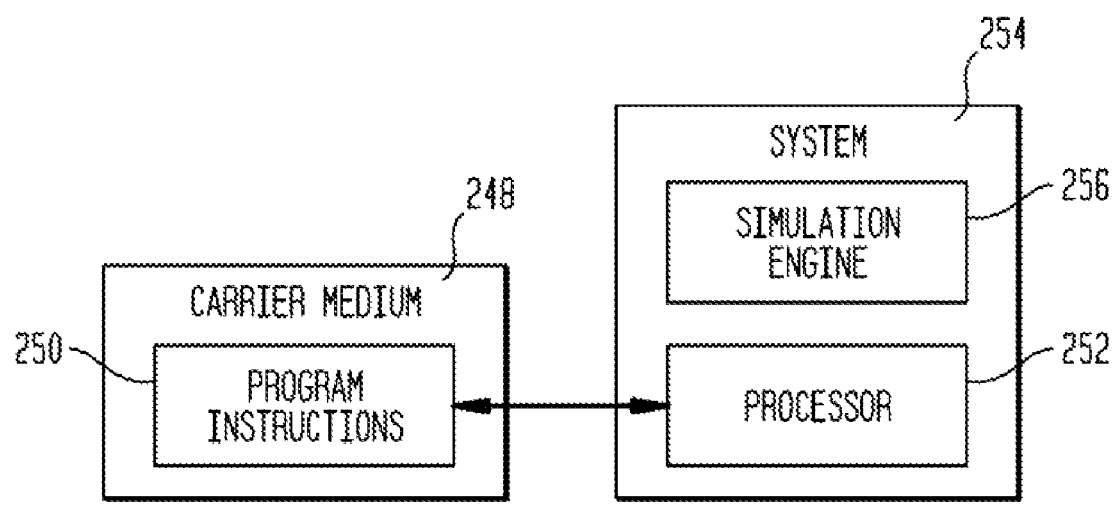
FIG. 15 is a schematic diagram illustrating one embodiment of a carrier medium that includes program instructions executable on a processor for performing one or more method embodiments described herein and one embodiment of a system configured to determine different process windows for a wafer printing process for different reticle designs.

FIG. 15 illustrates one embodiment of carrier medium 248 that includes program instructions 250 executable on processor 252 for performing a method for determining different process windows for a wafer printing process for different reticle designs. The method includes generating simulated images illustrating how each of the different reticle designs will be printed on a wafer at different values of one or more parameters of the wafer printing process. Generating the simulated images may be performed as described herein. For example, in one embodiment, generating the simulated images includes generating first simulated images that illustrate how each of the different reticle designs will be printed on a reticle using a reticle manufacturing process and generating the simulated images using the first simulated images. In addition, the simulated images may include simulated images of a complete chip defined by each of the different reticle designs. Furthermore, the different values may span a predetermined process window for the one or more parameters of the wafer printing process.

The method also includes detecting defects in each of the different reticle designs using the simulated images. Detecting the defects may be performed as described herein. For example, in one embodiment, detecting the defects includes determining which of the different values at which at least one of the defects appears in the simulated images. In another embodiment, detecting the defects includes determining one or more patterns in each of the different reticle designs in which the defects appear at the different values that are closer to nominal values for the one or more parameters than the different values at which the defects appear in other patterns in each of the different reticle designs. In addition, the method includes determining a process window for the wafer printing process for each of the different reticle designs based on results of the detecting step. Determining the process window may be performed as described herein.

Carrier medium 248, program instructions 250, and processor 252 may be further configured as described herein. In addition, the method for which program instructions 250 are executable may include any other step(s) described herein. For example, in one embodiment, the method includes subsequent to determining the process window, generating additional simulated images illustrating how each of the different reticle designs will be printed on the wafer at other different values of the one or more parameters. Differences between the other different values are finer than differences between the different values. Such an embodiment also includes performing the detecting step using the additional simulated images and determining the process window based on results of the detecting step performed using the additional simulated images.

In another embodiment, the method includes determining a center of the process window for each of the different reticle designs based on the results of the detecting step. In one such embodiment, the center of the process window is different for at least some of the different reticle designs. In some embodiments, the method includes determining a center of the process window for each of the different reticle des' ins based on the results of the detecting step such that a distance between the center and process window boundaries for each of the different reticle designs is maximized. In an additional embodiment, the method includes determining a center of the process window for each of the different reticle designs based on the results of the detecting step and performing the method, for each of the different reticle designs for which the center is different than predetermined nominal values for the one or more parameters, using other different values of the one or more parameters defined based on the center.

In one embodiment, the method includes altering at least one of the different reticle designs based on the results of the detecting step. In one such embodiment, altering at least one of the different reticle designs includes altering RET features of the at least one of the different reticle designs. In another embodiment, if the defects are detected for at least one of the different reticle designs, the method includes determining a center of the process window for the at least one reticle design based on the results of the detecting step and performing the method for the at least one reticle design until the defects are not detected for the at least one reticle design.

In an additional embodiment, the method includes generating additional simulated images illustrating how each of the different reticle designs will be printed on the wafer at different values of one or more other parameters of the wafer printing process, performing the detecting step using the additional simulated images, and optimizing the wafer printing process for each of the different reticle designs by selecting values for the one or more other parameters for each of the different reticle designs based on the results of the detecting step performed using the additional simulated images.

In a further embodiment, the method includes performing the method using other different values of the one or more parameters that exceed a predetermined process window for the one of more parameters of the wafer printing process. In one such embodiment, the detecting step performed using the simulated images generated at the other different values includes determining one or more patterns in each of the different reticle designs in which the defects appear at the other different values that are closer to nominal values for the one or more parameters than the other different values at which the defects appear in other patterns in each of the different reticle designs.

In some embodiments, the method includes generating a reticle manufacturing process for at least one of the different reticle designs based on the results of the detecting step. In another embodiment, the method includes generating an inspection process for at least one of the different reticle designs based on the results of the detecting step. In a further embodiment, the method includes generating a monitoring process for the wafer printing process for at least one of the different reticle designs based on the results of the detecting step. Each of the steps described above that may be included in the method for which the program instructions are executable may be performed according to any of the embodiments described herein.

FIG. 15 also illustrates one embodiment of system 254 configured to determine different process windows for a wafer printing process for different reticle designs. The system includes simulation engine 256 configured to generate simulated images illustrating how each of the different reticle designs will be printed on a wafer at different values of one or more parameters of the wafer printing process. The simulation engine may be configured to generate the simulated images according to any of the embodiments described herein. For example, in one embodiment, the simulation engine is configured to generate the simulated images by generating first simulated images illustrating how each of the different reticle designs s will be printed on a reticle using a reticle manufacturing process and generating the simulated images using the first simulated images. Generating the first simulated images and generating the simulated images using the first simulated images may be performed by the simulation engine according to any of the embodiments described herein. In another embodiment, the simulated images include simulated images of a complete chip defined by each of the different reticle designs. In an additional embodiment, the different values span a predetermined process window for the one or more parameters of the wafer printing process. The predetermined process window may include any of the predetermined process windows described herein.

The system also includes processor 252 configured to detect defects in each of the different reticle designs using the simulated images. The processor may be configured to detect the defects according to any of the embodiments described herein. For example, one embodiment the processor is configured to detect the defects by determining which of the different values at which at least one of the defects appears in the simulated images, and the processor may be configured to perform such determining according to any of the embodiments described herein. In another embodiment, the processor is configured to detect the defects by determining one or more patterns in each of the different reticle designs in which the defects appear at the different values that are closer to nominal values for the one or more parameters than the different values at which the defects appear in other patterns in each of the different reticle designs. The processor may be configured to determine such one or more patterns according to any of the embodiments described herein. Processor 252 is also configured to determine a process window for the wafer printing process for each of the different reticle designs based on the defects. The processor may be configured to determine the process window according to any of the embodiments described herein.

System 254, simulation engine 256, and processor 252 may be further configured as described herein. For example, in one embodiment, after the processor has determined the process window, the simulation engine is configured to generate additional simulated images illustrating how each of the different reticle designs will be printed on the wafer at other different values of the one or more parameters. The simulation engine may be configured to generate the additional simulated images according to any of the embodiments described herein. Differences between the other different values are finer than differences between the different values. In one such embodiment, the processor is also configured to detect the defects using the additional simulated images and to determine the process window based on the defects detected using the additional simulated images. The processor may be configured to detect the defects using the additional simulated images and to determine the process window based on the defects detected using the additional simulated images according to any of the embodiments described herein.

In another embodiment, the processor is configured to determine a center of the process window for each of the different reticle designs based on the defects. The processor may be configured to determine the center of the process window according to any of the embodiments described herein. In one such embodiment, the center of the process window is different for at least some of the different reticle designs. In an additional embodiment, the processor is configured to determine a center of the process window for each of the different reticle designs based on the defects such that a distance between the center and process window boundaries for each of the different reticle designs is minimized. The processor may be configured to determine the process window such that the distance between the center and the process window boundaries is maximized according to any of the embodiments described herein. In a further embodiment, the processor is configures to determine a center of the process window for each of the different reticle designs based on the defects according to any of the embodiments described herein, and the simulation engine is configured to generate the simulated images, for each of the different reticle designs for which the center is different than predetermined nominal values for the one or more parameters, using other different values of the one or more parameters defined based on the center. The simulation engine may be configured to generate the simulated images using the other different values according to any of the embodiments described herein. In addition, the processor is configured to detect the defects using the simulated images generated at the other different values according to any of the embodiments described herein and to determine the process window based on the defects detected in the simulated images generated at the other different values according to any of the embodiments described herein.

In some embodiments, the processor is configured to alter at least one of the different reticle designs based on the detects. The processor may be configured to alter at least one of the different reticle designs according to any of the embodiments described herein. In one such embodiment, the processor is configured to alter at least one of the different reticle designs by altering RET features of the at least one of the different reticle designs. The processor may be configured to alter the RET features of at least one of the different reticle designs according to any of the embodiments described herein. In another embodiment, if defects are detected for at least one of the different reticle designs, the processor is configured to determine a center of the process window for the at least one reticle design based on the defects. The processor may be configured to determine the center of the process window according to any of the embodiments described herein. In addition, after the processor has determined the center of the process window, the simulation engine is configured to generate the simulated images according to any of the embodiments described herein and the processor is configured to determine the center of the process window for the at least one reticle design according to any of the embodiments described herein, until the defects are not detected for the at least one reticle design.

In another embodiment, the simulation engine is configured to generate additional simulated images illustrating how each of the different reticle designs will be printed on the wafer at different values of one or more other parameters of the wafer printing process. The simulation engine may be configured to generate the additional simulated images according to any of the embodiments described herein. In one such embodiment, the processor is configured to detect the defects using the additional simulated images and to optimize the wafer printing process for each of the different reticle designs by selecting values for the one or more other parameters for each of the different reticle designs based on the defects detected using the additional simulated images. The processor may be configured to detect the defects using the additional simulated images according to any of the embodiments described herein and to optimize the wafer printing process according to any of the embodiments described herein.

In a further embodiment, the simulated engine is configured to generate the simulated images using other different values of the one or more parameters that exceed a predetermined process window for the one or more parameters of the wafer printing process. The simulation engine may be configured to generate the simulated images using the other different values according to any of the embodiments described herein. In one such embodiment, the processor is configured to detect the defects using the simulated images generated at the other different values according to any of the embodiments described herein and to determine the process window based on the defects detected in the simulated images generated at the other different values according to any of the embodiments described herein. In one such embodiment, the processor is configured to detect the defects using the simulated images generated at the other different values by determining one or more patterns in each of the different reticle designs with which the detects appear at the other different values that are closer to nominal values for the one or more parameters than the other different values at which the defects appear in other patterns in each of the different reticle designs. The processor may be configured to determine such one or more patterns according to any of the embodiments described herein.

In one embodiment, the processor is configured to generate a reticle manufacturing process for at least one of the different reticle designs based on the detects. The processor may be configured to generate the reticle manufacturing process according to any of the embodiments described herein. In another embodiment, the processor is configured to generate an inspection process for at least one of the different reticle designs based on the defects. The processor may be configured to generate the inspection process according to any of the embodiments described herein. In a further embodiment, the processor is configured to generate a monitoring process for the wafer printing process for at least one of the different reticle designs based on the defects. The processor may be configured to generate the monitoring process according to any of the embodiments described herein. Each of the embodiments of the system described above may be further configured as described herein.

The embodiments described herein have a number of advantages over other previously used methods and systems. For example, in today's fab, a few test structures are used to represent all designs to be manufactured using a process, and the overlap of those test structures' process windows is used as the overall process window. However, for each database design, such sampling becomes increasingly inadequate as process technology nodes progress smaller than 90 nm, especially when RET are applied to critical layers, because the weakest patters determine the real process windows and the few test structures are unlikely to provide a complete representation of all possible weakest patterns in every design to be manufactured using the process. In addition, for different design databases, which use the same lithography process, the weakest patterns are different. As a result, the overall process window may not be the "true" process window for a specific design, and the nominal exposure and focus values for the lithography process, determined by the center of the overall process window, may not be the "true" center of the process window for a specific design. In other words, the process center could be different for each individual design to be manufactured using the same process. Moreover, the current methodologies for addressing lithography process window issues have substantially long turn around times.

In contrast, the embodiments described herein use the methods and systems described above that are referred to herein as "DesignScan." In the embodiments described herein, DesignScan can be used to determine the weakest patterns (i.e., process window limiters) of a design database for a given lithography process based on a whole database inspection. In addition, DesignScan can be used to determine where in exposure-focus (FE) space those weakest patterns fail (not acceptable for process control). Since DesignScan can be used to inspect the whole database, there is no sampling issue as mentioned above. The FE values at which the weakest patterns fail define the process window for the database. Furthermore, the embodiments described herein provide faster time to market at target design performance through optimized lithography process windows. In addition, the relatively fast inspection speed enables inline inspection of the reticle designs.

Thus, in addition to determining the design-related defects, DesignScan can also be used in the following applications. For example, DesignScan can be used to predict a lithography process window for a specific design database. In such embodiments, the lithography process may be fixed. In this manner, the embodiments described herein can be used for design-based process window prediction.

In another example, the embodiments described herein can be used to re-center the process. For example, the nominal FE values can be moved to the center of the lithography process window based on the whole database simulation if the predetermined process window is incorrectly centered. In this manner, the embodiments described herein may be used for design-based process re-centering. The center of the lithography process window determined by the embodiments described herein may be different, and more accurate, than the center of the lithography process window determined by other previously used methods (e.g., from a Bossung plot determined using two or three features instead of the entire reticle design). By correctly centering the process, the process window is effectively enhanced (i.e., the minimum distance in FE space between the process window boundary and the process center can be enlarged).

In an additional example, instead of a common process center for all designs to be manufactured using the process, which is determined with a few test structures, the embodiments described herein can be used to optimize the process center for each individual design to enhance the effective process window of each particular design.

Furthermore, the embodiments described herein can be used for process optimization. For example, scanner settings (e.g., illumination source shape, NA, etc.) can be varied to maximize the lithography process window for a specific design database. In this manner, the embodiments described herein may be used for design-based process optimization. Any other parameters of the lithography process such as the resist, the resist processing parameters (e.g., parameters of the lithography track), parameters of the exposure tool, parameters other than those of the exposure tool, or some combination thereof may also be selected by the embodiments described herein to optimize the process.

All of the methods described herein may include storing results and/or output of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by one or more software applications and/or modules, used by one or more methods, one or more systems, and the like. In an embodiment, for example, after a method generates simulated images, detects defects, and/or determines a process window, the generated simulated images, the detected defects, and/or the determined process window may be stored in a storage medium such that the stored generated simulated images, detected defects, and/or determined process window may be accessed, displayed, manipulated, and/or used by any or all of the user the software applications and/or modules, the one or more methods, one or more systems, and the like, as described above. Furthermore, the results may be stored "permanently," "semi-permanently," temporarily, or for some period of time. For example, the storage medium may include random access memory (RAM), and the results may not necessarily persist indefinitely in the storage medium.

Further modifications and alternative embodiments of various aspects of the invention may be apparent to those skilled in the art in view of this description. For example, computer-implemented methods and systems for determining different process windows for a wafer printing process for different reticle designs are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for determining different process windows for a wafer printing process for different reticle designs, comprising:
   generating simulated images illustrating how each of the different reticle designs will be printed on a wafer at different values of one or more parameters of the wafer printing process;
   detecting defects in each of the different reticle designs using the simulated images; and
   determining a process window for the wafer printing process for each of the different reticle designs based on results of said detecting.

2. The method of claim 1, wherein said generating comprises generating first simulated images illustrating how each of the different reticle designs will be printed on a reticle using a reticle manufacturing process and generating the simulated images using the first simulated images.

3. The method of claim 1, wherein the simulated images comprise simulated images of a complete chip defined by each of the different reticle designs.

4. The method of claim 1, further comprising subsequent to said determining, generating additional simulated images illustrating how each of the different reticle designs be printed on the wafer at other different values of the one or more parameters, wherein differences between the other different values are finer than differences between the different values, performing said detecting using the additional simulated images, and performing said determining based on results of said detecting performed using the additional simulated images.

5. The method of claim 1, further comprising determining a center of the process window for each of the different reticle designs based on the results of said detecting.

6. The method of claim 1, further comprising determining a center of the process window for each of the different reticle designs based on the results of said detecting such that a distance between the center and process window boundaries for each of the different reticle designs is maximized.

7. The method of claim 1, further comprising determining a center of the process window for each of the different reticle designs based on the results of said detecting, wherein the center of the process window is different for at least some of the different reticle designs.

8. The method of claim 1, further comprising determining a center of the process window for each of the different reticle designs based on the results of said detecting and performing the method, for each of the different reticle designs for which the center is different than predetermined nominal values for the one or more parameters, using other different values of the one or more parameters defined based on the center.

9. The method of claim 1, further comprising altering at least one of the different reticle designs based on the results of said detecting, wherein said altering comprises altering resolution enhancement technology features of the at least one of the different reticle designs.

10. The method of claim 1, further comprising if the defects are detected for at least one of the different reticle designs, determining a center of the process window for the at least one reticle design based on the results of said detecting, and performing the method for the at least one reticle design until the defects are not detected for the at least one reticle design.

11. The method of claim 1, further comprising generating additional simulated images illustrating how each of the different reticle designs will be printed on the wafer at different values of one or more other parameters of the wafer printing process, performing said detecting using the additional simulated images, and optimizing the wafer printing process for each of the different reticle designs by selecting values for the one or more other parameters for each of the different reticle designs based on the results of said detecting performed using the additional simulated images.

12. The method of claim 1, wherein the different values span a predetermined process window for the one or more parameters of the wafer printing process.

13. The method of claim 1, wherein said detecting comprises determining which of the different values at which at least one of the defects appears in the simulated images.

14. The method of claim 1, wherein said detecting comprises determining one or more patterns in each of the different reticle designs in which the defects appear at the different values that are closer to nominal values for the one or more parameters than the different values at which the defects appear in other patterns in each of the different reticle designs.

15. The method of claim 1, further comprising performing the method using other different values of the one or more parameters that exceed a predetermined process window for the one or more parameters of the wafer printing process.

16. The method of claim 1, further comprising performing the method using other different values of the one or more parameters that exceed a predetermined process window for the one or more parameters of the wafer printing process, wherein said detecting using the simulated images generated at the other different values comprises determining one or more patterns in each of the different reticle designs in which the defects appear at the other different values that are closer to nominal values for the one or more parameters than the other different values at which the defects appear in other patterns in each of the different reticle designs.

17. The method of claim 1, farther comprising generating a reticle manufacturing process for at least one of the different reticle designs based on the results of said detecting.

18. The method of claim 1, farther comprising generating an inspection process for at least one of the different reticle designs based on the results of said detecting.

19. The method of claim 1, further comprising generating a monitoring process for the wafer printing process far at least one of the different reticle designs based on the results of said detecting.

20. A non-transitory computer readable medium, comprising program instructions executable on a processor for performing a method for determining different process windows for a wafer printing process for different reticle designs, wherein the method comprises:
   generating simulated images illustrating how each of the different reticle designs will be printed on a wafer at different values of one or more parameters of the wafer printing process;

detecting defects in each of the different reticle designs using the simulated images; and determining a process window for the wafer printing process for each of the different reticle designs based on results of said detecting.

21. A system configured to determine different process windows for a wafer printing process for different reticle designs, comprising:

a simulation engine configured to generate simulated images illustrating how each of the different reticle designs will be printed on a wafer at different values of one or more parameters of the wafer printing process; and a processor configured to detect defects in each of the different reticle designs using the simulated images and to determine a process window for the wafer printing process for each of the different reticle designs based on the defects.

* * * * *